(12) United States Patent
Takasaki

(10) Patent No.: US 10,531,593 B2
(45) Date of Patent: Jan. 7, 2020

(54) SHUTTER, FAN UNIT, AND ELECTRONIC APPARATUS

(71) Applicant: FUJITSU LIMITED, Kawasaki-shi, Kanagawa (JP)

(72) Inventor: Hisashi Takasaki, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/882,615

(22) Filed: Jan. 29, 2018

(65) Prior Publication Data
US 2018/0279506 A1 Sep. 27, 2018

(30) Foreign Application Priority Data
Mar. 21, 2017 (JP) .................................. 2017-054193

(51) Int. Cl.
*H05K 7/20* (2006.01)
*H05K 5/02* (2006.01)

(52) U.S. Cl.
CPC ....... *H05K 7/20181* (2013.01); *H05K 5/0213* (2013.01); *H05K 7/20172* (2013.01)

(58) Field of Classification Search
CPC ........... H05K 7/20181; H05K 7/20172; H05K 7/20554–20572; H05K 7/20718–20736; H05K 7/20618; H05K 7/1489; H05K 7/20563–20581; H05K 5/0213; G06F 1/206
USPC .............. 361/679.49–679.51, 695, 724–727; 454/184; 165/205, 208–209, 212–214; 417/360; 415/206
See application file for complete search history.

(56) References Cited

U.S. PATENT DOCUMENTS

| | | | | |
|---|---|---|---|---|
| 3,204,548 A | * | 9/1965 | McCabe | F24F 13/15 454/352 |
| 5,277,658 A | * | 1/1994 | Goettl | F24F 11/043 137/512.1 |
| 5,681,144 A | * | 10/1997 | Spring | F01D 5/187 415/115 |
| 6,386,828 B1 | * | 5/2002 | Davis | A01K 1/0052 415/147 |
| 7,474,528 B1 | * | 1/2009 | Olesiewicz | H05K 7/20154 361/694 |
| 2001/0046838 A1 | * | 11/2001 | Hertel | F24F 13/1406 454/259 |

(Continued)

FOREIGN PATENT DOCUMENTS

| | | |
|---|---|---|
| JP | 2011-231954 | 11/2011 |
| JP | 2012-190222 | 10/2012 |
| WO | WO 01/06083 | * 1/2001 |

*Primary Examiner* — Dion Ferguson
*Assistant Examiner* — Amir A Jalali
(74) *Attorney, Agent, or Firm* — Fujitsu Patent Center

(57) ABSTRACT

A shutter includes a base that has a ventilation hole, and a louver that is attached to the base and opens and closes the ventilation hole, wherein the louver includes a turning portion pivotally and turnably supported on the base, and a blade coupled to the turning portion at one end, the blade turns about a turning axis of the turning portion to open the ventilation hole by receiving air passing through the ventilation hole, and the blade has a shape in which an air receiving surface which receives the air is curved toward a direction in which the blade turns to open the ventilation hole, with respect to a plane which couples the turning axis and a turning end of the blade.

12 Claims, 17 Drawing Sheets

(56) References Cited

U.S. PATENT DOCUMENTS

| | | | |
|---|---|---|---|
| 2004/0212784 A1* | 10/2004 | Hsu | G03B 21/16 |
| | | | 353/61 |
| 2008/0068791 A1* | 3/2008 | Ebermann | G06F 1/20 |
| | | | 361/679.49 |
| 2011/0235272 A1* | 9/2011 | Bash | H05K 7/20609 |
| | | | 361/692 |
| 2011/0259550 A1* | 10/2011 | Komaba | F16K 1/222 |
| | | | 165/96 |
| 2015/0252813 A1* | 9/2015 | Shih | F04D 25/14 |
| | | | 415/146 |

* cited by examiner

US 10,531,593 B2

SHUTTER, FAN UNIT, AND ELECTRONIC APPARATUS

CROSS-REFERENCE TO RELATED APPLICATION

This application is based upon and claims the benefit of priority of the prior Japanese Patent Application No. 2017-54193, filed on Mar. 21, 2017, the entire contents of which are incorporated herein by reference.

FIELD

The embodiments discussed herein are related to a shutter, a fan unit, and an electronic apparatus.

BACKGROUND

There has been known a cooling method in which outside cool air is taken into an apparatus using a fan to cool electronic devices and electronic components inside, and warm air produced along with the cooling is exhausted to the outside of the apparatus. As for such a cooling method, there has been known a technique of providing a shutter to an apparatus to inhibit the exhausted warm air from flowing back into the apparatus when the fan stops. Examples of such known techniques include providing a check valve which is opened by the intake and exhaust by the fan and closed when the fan stops, and providing a flap which turns by receiving air pressure of a countercurrent air flow produced when the fan stops, and closes the flow passage.

For an air-pressure type shutter which opens by the intake and exhaust by a fan, when the rotation speed of the fan decreases and the amount of air flow decreases, it is possible that the shutter does not open in some cases. If the shutter does not open, the efficiency of cooling heat generating objects in the apparatus, such as electronic devices and electronic components, goes down, and it is possible to cause the performance deterioration and failure.

The followings are reference documents.
[Document 1] Japanese Laid-open Patent Publication No. 2012-190222 and
[Document 2] Japanese Laid-open Patent Publication No. 2011-231954.

SUMMARY

According to an aspect of the invention, a shutter includes a base that has a ventilation hole, and a louver that is attached to the base and opens and closes the ventilation hole, wherein the louver includes a turning portion pivotally and turnably supported on the base, and a blade coupled to the turning portion at one end, the blade turns about a turning axis of the turning portion to open the ventilation hole by receiving air passing through the ventilation hole, and the blade has a shape in which an air receiving surface which receives the air is curved toward a direction in which the blade turns to open the ventilation hole, with respect to a plane which couples the turning axis and a turning end of the blade.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
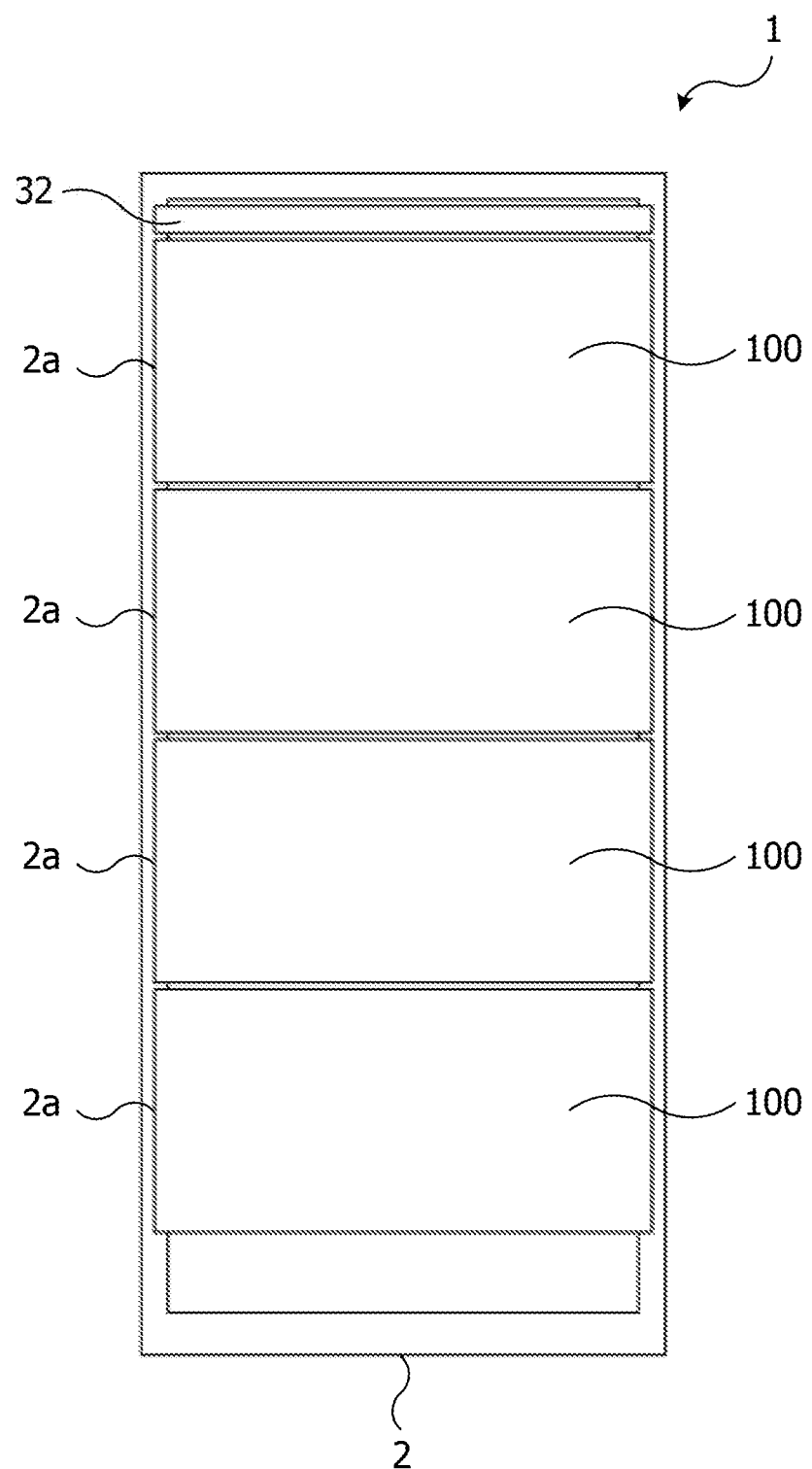
FIG. 1 is a diagram illustrating an example of a rack cabinet.

FIG. 1 is a diagram illustrating an example of a rack cabinet. FIG. 1 is a schematic front view illustrating a main part of the example of the rack cabinet.

The rack cabinet 1 illustrated in FIG. 1 includes a frame 2 having housing portions 2a on multiple shelves (here, four shelves as an example). In each housing portion 2a of the frame 2 is accommodated an electronic apparatus 100 including a plug-in unit in which electronic components such as semiconductor devices are mounted on a circuit board such as a mother board.

Note that here, the rack cabinet 1 in which one or more electronic apparatuses 100 are mounted in the multiple housing portions 2a of the frame 2 is also referred as an electronic device or an electronic apparatus.

Figure 2A:
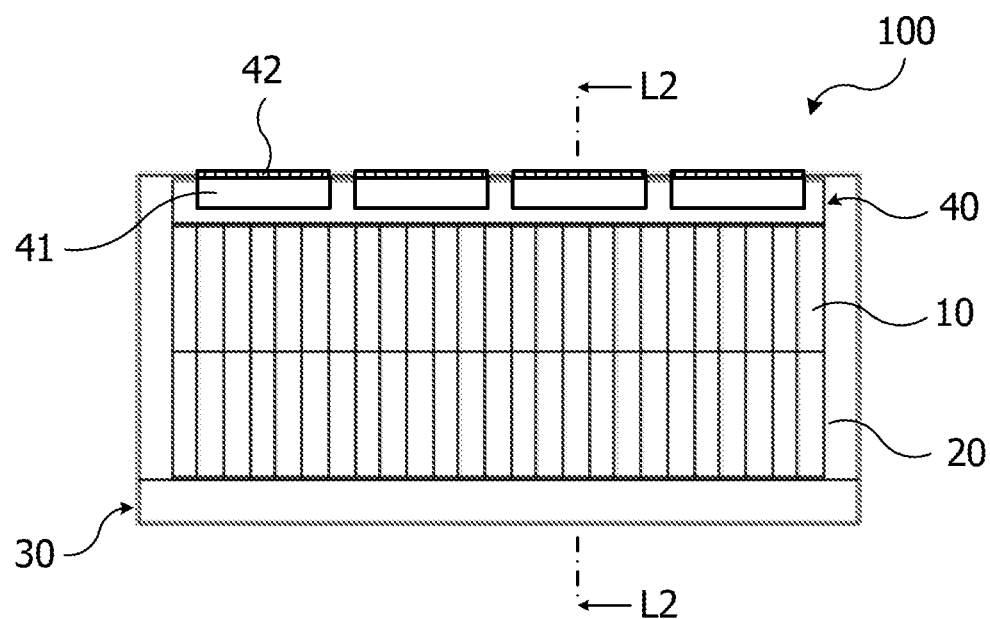
FIGS. 2A and 2B are diagrams (part 1) illustrating an example of an electronic apparatus mounted on the rack cabinet.
Figure 2B:
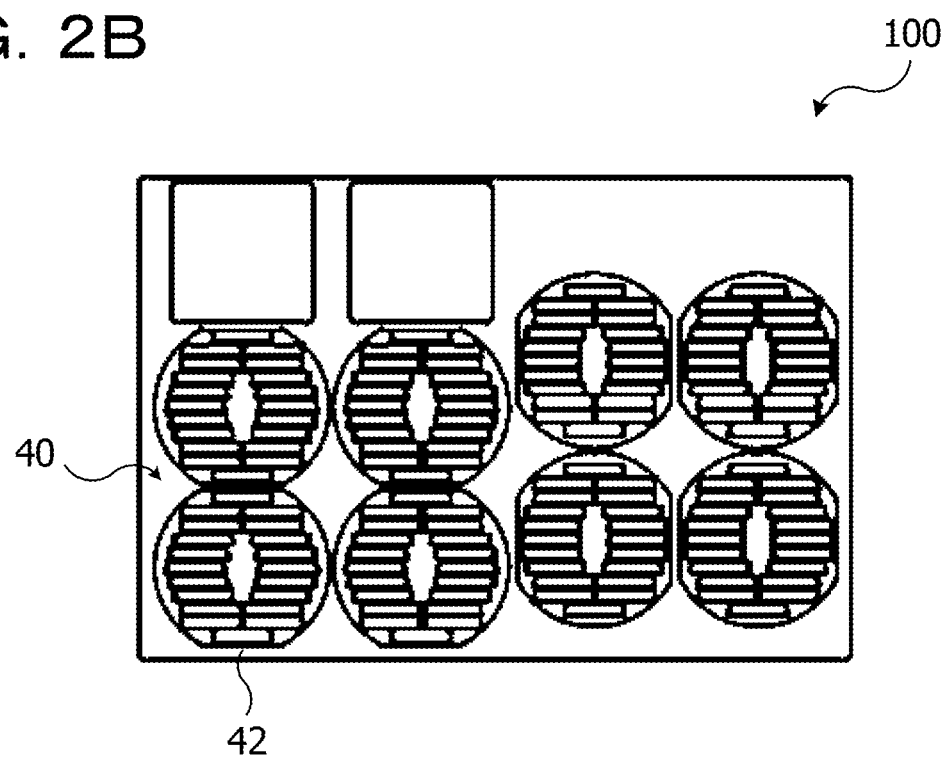
Figure 3:
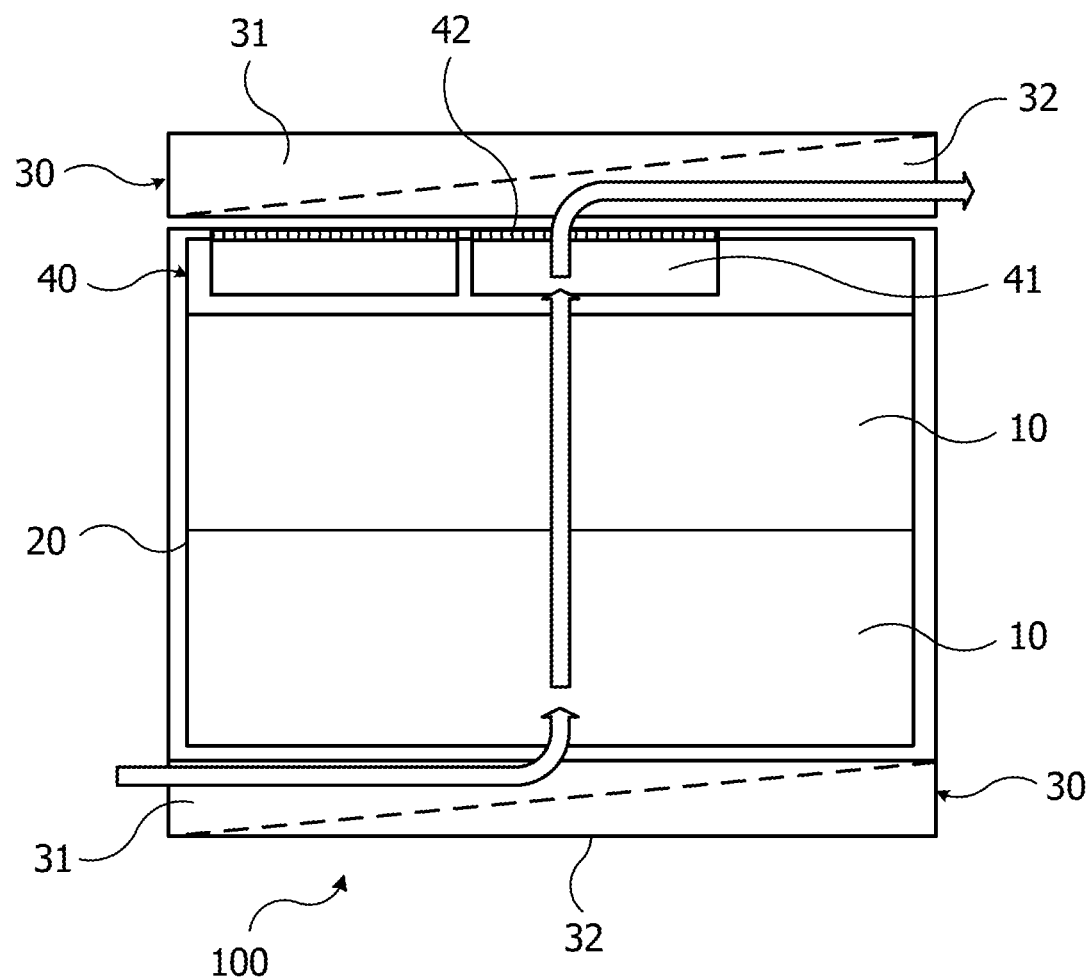
FIG. 3 is a diagram (part 2) illustrating the example of the electronic apparatus mounted on the rack cabinet.

FIGS. 2A and 2B, and FIG. 3 are diagrams illustrating an example of an electronic apparatus mounted on the rack cabinet. FIG. 2A is a schematic front view illustrating a main part of the example of the electronic apparatus, and FIG. 2B is a schematic plan view illustrating the main part of the example of the electronic apparatus. FIG. 3 is a schematic cross-sectional view taken along line L2-L2 in FIG. 2A.

As illustrated in FIG. 2A, the electronic apparatus 100 includes multiple flat-plate type plug-in units 10. Although illustration is omitted here, each plug-in unit 10 includes a circuit board such as a mother board and electronic components such as semiconductor devices mounted thereon. In the electronic apparatus 100, multiple plug-in units 10 as above are accommodated and mounted, for example, on both the upper part and the lower part of a shelf 20 as housing portions, each being oriented vertically and held side by side. The plug-in unit 10 is mounted on the shelf 20 to be removable therefrom.

As illustrated in FIGS. 2A and 3, below the shelf 20 of the electronic apparatus 100 is disposed an intake-exhaust duct 30. As illustrated in FIG. 3, for example, the intake-exhaust duct 30 is divided into two rooms: one on the front side and the other on the back side of the electronic apparatus 100. The front side room made by the division of the intake-exhaust duct 30 is used as an intake duct 31 of the electronic apparatus 100. The back side room made by the division of the intake-exhaust duct 30 is used as an exhaust duct 32 for another electronic apparatus 100 mounted on the lower shelf next to this electronic apparatus 100.

As illustrated in FIGS. 2A and 2B and FIG. 3, over the shelf 20 of the electronic apparatus 100 is disposed a fan unit 40. The fan unit 40 includes multiple fans 41 and shutters 42 disposed over the respective fans 41. Each fan 41 is configured to rotate to take in air from the inside of the shelf 20 and exhaust the air to the outside of the shelf 20. The shutter 42 is disposed downstream of the fan 41 in the air flow direction (on the exhaust side) and configured to open by the air flow from the fan 41, which is described later.

FIG. 3 schematically illustrates an example of the air flow in the electronic apparatus 100 with thick arrows. As illustrated in FIG. 3, in the electronic apparatus 100, the rotation of the fan 41 of the fan unit 40 takes in air (cool air) outside the electronic apparatus 100 through the front intake duct 31, and the taken cool air is introduced into the shelf 20 accommodating the multiple plug-in units 10. The cool air introduced into the shelf 20 cools the plug-in units 10 (heat generating objects included therein such as semiconductor devices) in the shelf 20, and this cooling produces warmed air (warm air) in the shelf 20. The warm air in the shelf 20, sucked by the rotation of the fans 41, passes through the shutters 42 and exhausted to the exhaust duct 32 of the intake-exhaust duct 30 of another electronic apparatus 100 mounted on the upper shelf next to this electronic apparatus 100, and then the warm air is exhausted from the exhaust duct 32 to the back side of the electronic apparatus 100.

The electronic apparatus 100 employs, for example, a cooling system utilizing such fan units 40, or what is called a forced air cooling system, to cool the plug-in units 10.

Note that the rack cabinet 1 illustrated in the above FIG. 1 has an exhaust duct 32 over the uppermost housing portion 2a. Through this exhaust duct 32, the fan unit 40 of the electronic apparatus 100 mounted in the uppermost housing portion 2a exhausts air to the back side.

Next, descriptions are further provided for a shutter 42 of the fan unit 40 described above.

Figure 4A:
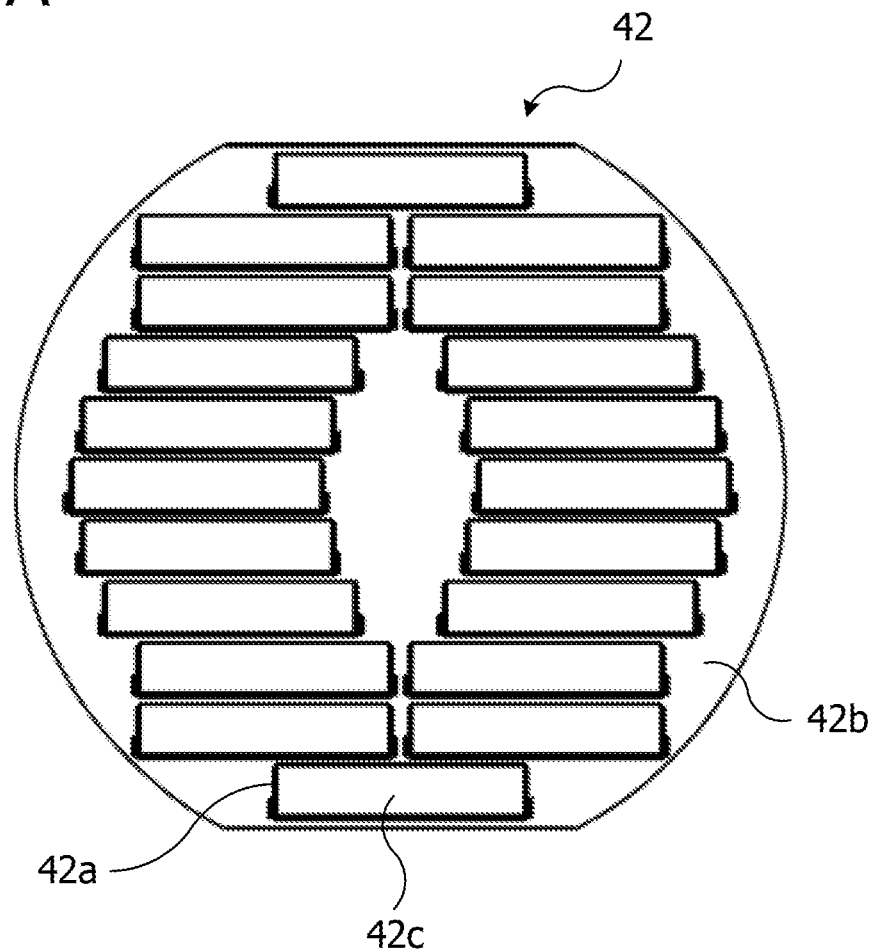
FIGS. 4A and 4B are diagrams illustrating an example of a shutter.
Figure 4B:
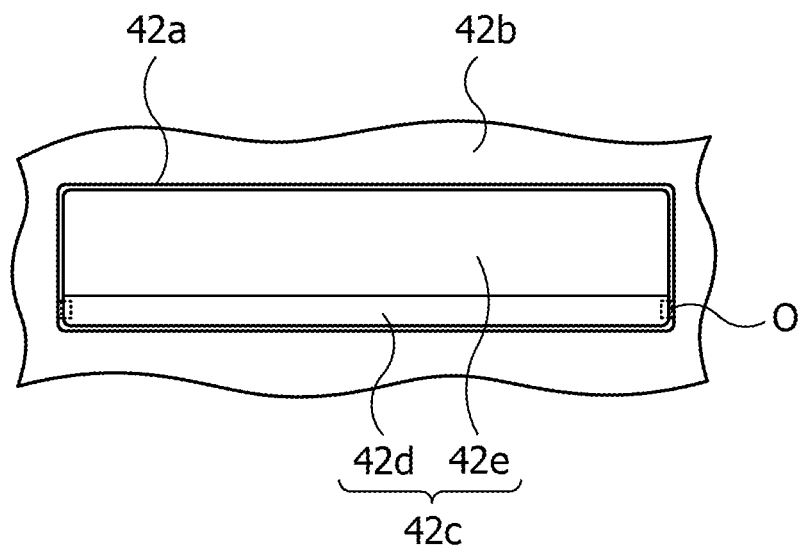

FIGS. 4A and 4B are diagrams illustrating an example of a shutter. FIG. 4A is a schematic plan view illustrating the example of the shutter, and FIG. 4B is a partially-enlarged schematic plan view illustrating the example of the shutter.

As illustrated in FIGS. 4A and 4B, the shutter 42 of the fan unit 40 includes a base 42b with multiple ventilation holes 42a and multiple louvers 42c attached to the base 42b, the multiple louvers 42c opening and closing respective ventilation holes 42a. Note that FIGS. 4A and 4B illustrate a state where the ventilation holes 42a are closed by the louvers 42c. Although illustration is omitted here, the foregoing fan 41 included in the fan unit 40 is disposed below the shutter 42 (in the depth direction of the paper in FIG. 4A or FIG. 4B), and the rotation of the fan 41 blows air into the ventilation holes 42a (exhausts warm air from the foregoing shelf 20).

As illustrated in FIG. 4B, each louver 42c includes a turning portion 42d, the axis of which is turnably supported by the base 42b, and a blade 42e connected to the turning portion 42d at one end (for example, integrally formed with the turning portion 42d). When the fan 41 disposed below the louver 42c does not blow air in other words, when the fan 41 is not operating, the louver 42c closes the ventilation hole 42a by its own weight. When the fan 41 operates and blows air from below, the louver 42c receives the air with the blade 42e, and the blowing force turns the blade 42e about the turning portion 42d, opening the ventilation hole 42a.

For example, the fan unit 40 employs what is called air-pressure type shutters 42 in which as above, while the fan 41 is operating, the blowing air makes the louvers 42c open the ventilation holes 42a, and while the fan 41 is not operating, the louvers 42c close the ventilation holes 42a by their own weights.

In the shutter 42, when the fan 41 stops, the louvers 42c close the ventilation holes 42a, so that the warm air (FIG. 3) which was once exhausted from the inside of the shelf 20 through the shutters 42 is kept from flowing back into the shelf 20 even when the fan 41 stops. As described above, since the warm air is kept from flowing back into the shelf 20, the temperature rise of the plug-in units 10 mounted inside the shelf 20 is reduced. In addition, this also keeps the warm air flowing back into the shelf 20 from flowing to the front side of a second electronic apparatus 100 mounted on another shelf of the rack cabinet 1 (FIG. 1), and being taken into the intake duct 31 (FIGS. 2A, 2B and 3) of the second electronic apparatus 100. As a result, this suppresses the decrease of the cooling efficiency of the plug-in unit 10 of the second electronic apparatus 100 which is caused by the backflow of the air. This reduces overheating of the plug-in units 10 of the electronic apparatuses 100 mounted on the rack cabinet 1, and also reduces performance deterioration and occurrence of failure of the plug-in units 10 and the electronic apparatuses 100 caused by the overheating.

Here, descriptions are provided for opening and closing operation of a louver, using an example of a shutter according to an aspect.

Figure 5A:
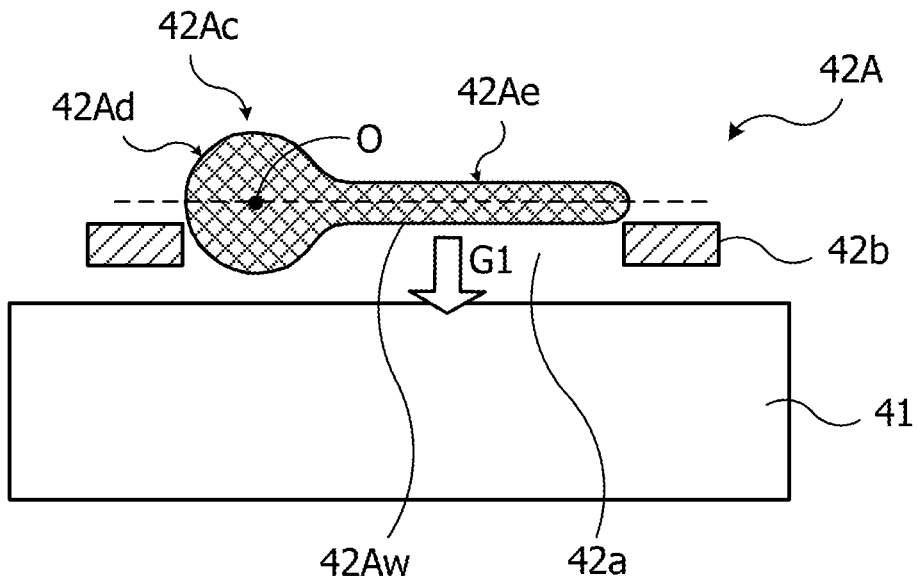
FIGS. 5A and 5B are explanatory diagrams of a shutter according to an aspect.
Figure 5B:
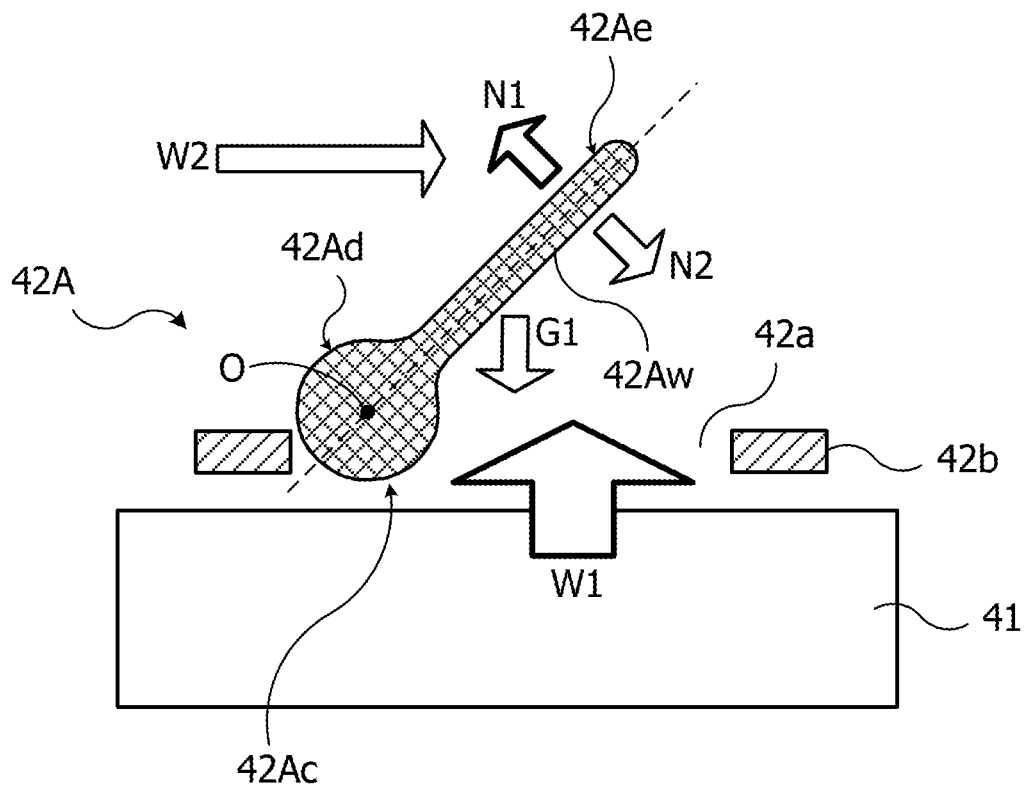

FIGS. 5A and 5B are explanatory diagrams of a shutter according to an aspect. FIG. 5A illustrates a state where a louver of the shutter according to the aspect is closed, and FIG. 5B illustrates a state where the louver is open.

The shutter 42A illustrated in FIGS. 5A and 5B includes a turning portion 42Ad turnably attached to a base 42b having ventilation holes 42a, and a louver 42Ac having a blade 42Ae connected to the turning portion 42Ad at one end. Below the shutter 42A is disposed a fan 41 which blows air into the ventilation holes 42a. The blade 42Ae of the louver 42Ac illustrated in FIGS. 5A and 5B has a flat plate shape in which the surface (air receiving surface) 42Aw which receives air W1 blown from the fan 41 and passing through the ventilation hole 42a is flat.

As an example, assume that the shutter 42A as described above is used as the shutter 42 illustrated in the above FIGS. 2A to 4B. Specifically, a fan unit including the shutters 42A illustrated in FIGS. 5A and 5B and the fans 41 disposed therebelow is disposed above the shelf 20 in which the plug-in units 10 are mounted. The rotation of the fans 41 takes in cool air from the intake duct 31 below the shelf 20 and cools the plug-in units 10. The warm air produced along with the cooling is exhausted via the fans 41 and the shutters 42A to the exhaust duct 32.

In the shutter 42A having the louver 42Ac with a flat air receiving surface 42Aw, when the fan 41 stops, as described in FIG. 5A, the louver 42Ac closes the ventilation hole 42a by its own weight G1, in the same way as above.

While the fan 41 is operating, as illustrated in FIG. 5B, the blade 42Ae of the louver 42Ac receives the air W1 blown into the ventilation holes 42a by the rotation of the fan 41, with the flat air receiving surface 42Aw. On the blade 42Ae which receives the air W1 with the air receiving surface 42Aw, a moment N1 is applied which causes to open the ventilation hole 42a and the force of the air W1 turns the blade 42Ae at the turning portion 42Ad (about the turning axis O), thereby opening the ventilation hole 42a. Through this opened ventilation hole 42a, the warm air inside the shelf 20 is exhausted.

However, on the louver 42Ac which opened the ventilation hole 42a as above, a moment N2 is applied which causes to close the ventilation hole 42a, and which was caused by the own weight G1 and air W2 which was exhausted from other louvers and blown to the opposite surface from the air receiving surface 42Aw of the blade 42Ae. When the moment N1 exceeding the moment N2 is applied to the louver 42Ac by the air W1 blown from the fan 41, the louver 42Ac is held open. As the louver 42Ac opens wider, the moment N1 which was caused by the air W1 from the fan 41 and which causes to open the louver 42Ac decreases, and the moment N2 which was caused by the air W2 exhausted from other louvers and which causes to close the louver 42Ac increases. For this reason, to hold the louver 42Ac open, the rotation speed of the fan 41 is increased to increase the amount of the air W1 in some case. However, the increase of the rotation speed of the fan 41 may cause the increase of the power consumption of not only the electronic apparatus 100 but also the rack cabinet 1 (electronic device or electronic apparatus) on which the electronic apparatus 100 is mounted, or may cause the increase of operation sound (noise) along with the rotation of the fan 41.

On the other hand, to reduce the power consumption and noise of the electronic apparatus 100 and the rack cabinet 1, a method of controlling the rotation speed of the fan 41 is conceivable, in which the rotation speed is controlled based on the temperature of the external environment, or the temperature of the electronic apparatus 100, the plug-in unit 10 thereof, or an electronic component thereof. However, if the rotation speed of the fan 41 is controlled with such a method to be lowered based on the temperature of the external environment or the electronic apparatus 100 or the like, the moment N1 to open the louver 42Ac may not be sufficiently obtained in some cases. If the rotation speed of the fan 41 is lowered and the moment N1 enough to open the louver 42Ac is not obtained, the louver 42Ac will not open and warm air inside the shelf 20 will not be exhausted. This may lead to overheating of the plug-in unit 10 in the shelf 20 and the electronic apparatus 100, on which the plug-in unit 10 is mounted, as well as performance deterioration or failure of the plug-in unit 10 and the electronic apparatus 100 due to such overheating.

As a method to solve the problems above, it is conceivable that the material and the thickness of the louver 42Ac are changed to reduce the weight thereof. However, the weight reduction has a limitation in light of the strength and the production process of the louver 42Ac.

In view of the above points, the shutter 42 illustrated in foregoing FIGS. 2A to 4B employs a shutter with a configuration described as embodiments below.

First of all, a first embodiment is described.

Figure 6A:
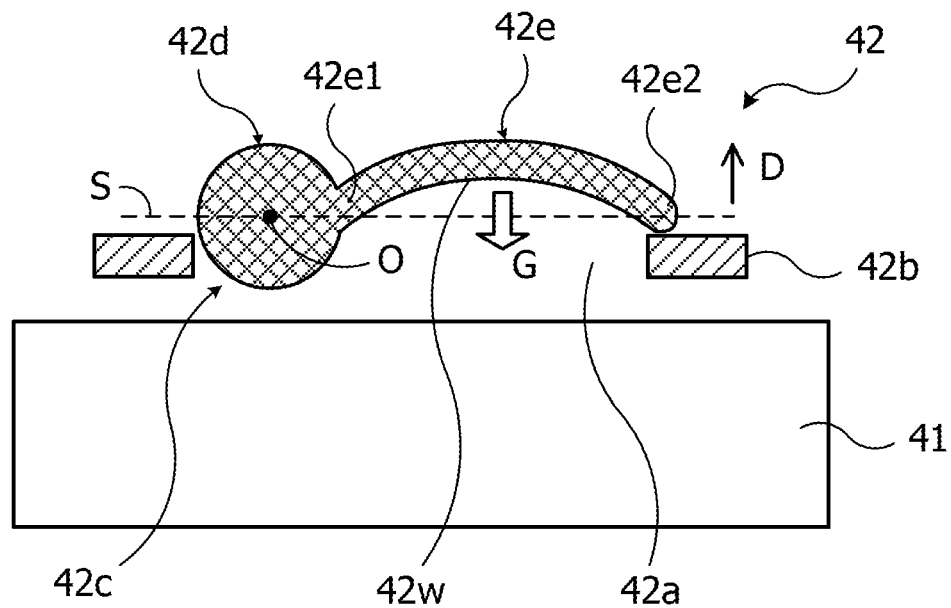
FIGS. 6A and 6B are diagrams illustrating an example of a shutter according to a first embodiment.
Figure 6B:
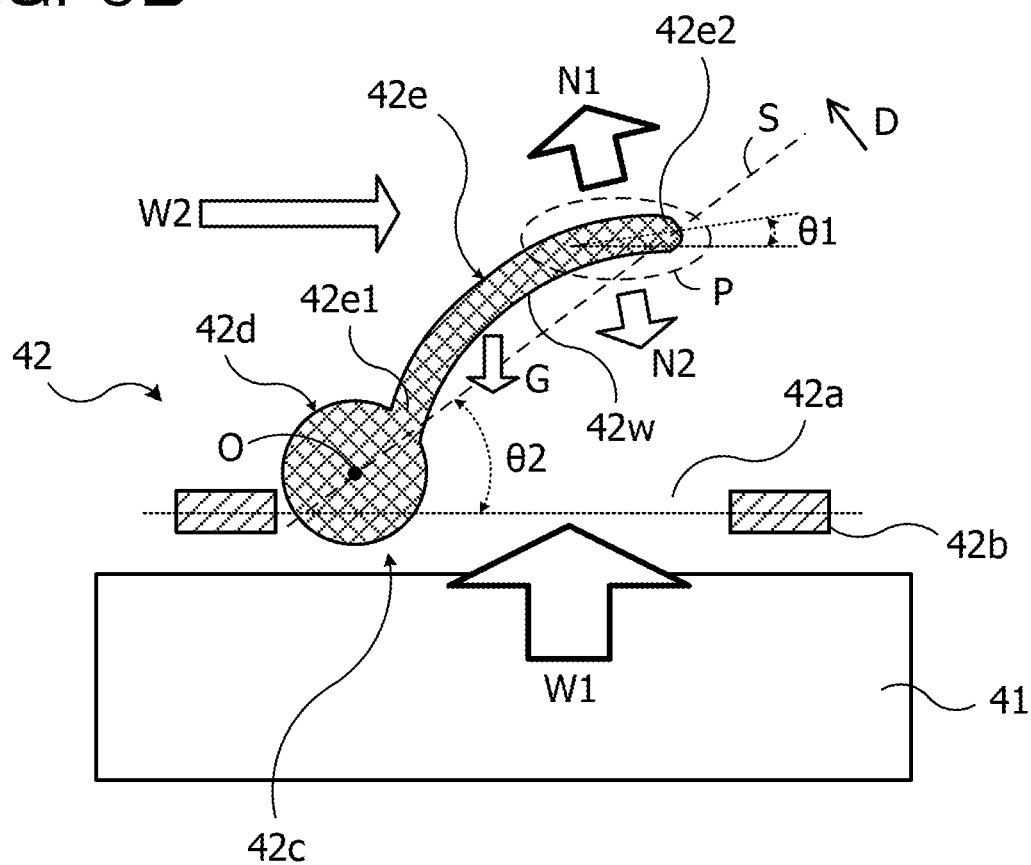

FIGS. 6A and 6B are diagrams illustrating an example of a shutter according to a first embodiment. Here, one louver of the shutter is focused on. FIG. 6A is a schematic cross-sectional view illustrating a main part of the shutter at the time when the louver is closed, and FIG. 6B is a schematic cross-sectional view illustrating the main part of the shutter at the time when the louver is open.

The shutter 42 illustrated in FIG. 6A and FIG. 6B includes a louver 42c having a turning portion 42d turnably attached to the base 42b having ventilation holes 42a, and a blade 42e connected to the turning portion 42d. The blade 42e is turnable on the turning portion 42d (the turning axis O). Below the shutter 42 including the louvers 42c described above is disposed the fan 41 which blows air into the ventilation holes 42a.

The base 42b is made of various materials, such as a metal material, a resin material, or a ceramic material. The turning portion 42d and the blade 42e of the louver 42c are made of various materials, for example, resin materials such as modified polyphenylene ether or polycarbonate. The materials used for the turning portion 42d and the blade 42e may be the same with or different from each other. Note that since the louver 42c is turned by the force of the air W1 as described later, it is preferable that at least the blade 42e of the turning portion 42d and the blade 42e be made of a material with a small specific gravity which makes the part light.

The fan unit 40 including the shutters 42 as illustrated in FIGS. 6A and 6B and the fans 41 therebelow is disposed above the shelf 20, including the plug-in units 10, of the electronic apparatus 100 (FIG. 1) mounted on the rack cabinet 1 (FIGS. 2A to 4B). The rotation of the fans 41 takes in cool air from the intake duct 31 below the shelf 20 and cools the plug-in units 10. The cooling produces warm air, which is exhausted via the fans 41 and the shutters 42 to the exhaust duct 32.

The blade 42e of the louver 42c illustrated in FIGS. 6A and 6B has a curved plate shape in which an air receiving surface 42w which receives the air W1 blown from the fan 41 and passing through the ventilation hole 42a is a curved surface. The air receiving surface 42w has a curved surface which is curved toward the direction D in which the blade 42e turns to open the ventilation hole 42a with respect to the plane S connecting the turning axis O of the turning portion 42d, to which one end (base) 42e1 of the blade 42e is connected, and the other end (turning end) 42e2 of the blade 42e. Here, as an example, is illustrated the air receiving surface 42w curved in an arcuate shape in cross-section.

As for the louver 42c including the blade 42e of which the air receiving surface 42w is in a curved shape as above, while the fan 41 is not operating, the louver 42c closes the ventilation hole 42a by its own weight G as illustrated in FIG. 6A.

While the fan 41 is operating, as illustrated in FIG. 6B, the blade 42e of the louver 42c receives the air W1 blown into the ventilation hole 42a by the rotation of the fan 41, at the curved air receiving surface 42w. On the blade 42e receiving the air W1 at the air receiving surface 42w, the moment N1 is applied which causes to open the ventilation hole 42a, and the force of the air W1 turns the blade 42e at the turning portion 42d (about the turning axis O), thereby opening the ventilation hole 42a. The warm air inside the shelf 20 is exhausted through this opened ventilation holes 42a.

As for the louver 42c, since the air receiving surface 42w of the blade 42e is the curved surface, the angle of the distal end portion P relative to the base 42b at the time when the blade 42e is turned in the direction D to open the ventilation hole 42a is smaller than that of the foregoing blade 42Ae (FIG. 5B). Specifically, as for the louver 42c, the angle θ1 of the distal end portion P relative to the base 42b at the time when the blade 42e is turned to open the ventilation hole 42a is smaller than the angle θ2 of the plane S connecting the turning axis O and the turning end 42e2 relative to the base 42b, as illustrated in FIG. 6B. This angle θ2 corresponds to the angle of the foregoing blade 42Ae of which the air receiving surface 42Aw is a flat surface. As described above, the angle θ1 of the distal end portion P of the blade 42e is smaller than the angle θ2 of the foregoing blade 42Ae (the distal end portion thereof) when the blade 42e is turned to open the ventilation hole 42a.

The shutter 42 illustrated in FIGS. 6A and 6B is intended to reduce the moment N2 in the closing direction and increase the moment N1 in the opening direction by decreasing the angle θ1 of the distal end portion P at the time when the blade 42e is turned to open the ventilation hole 42a. In other words, by making it more difficult for the surface opposite to the air receiving surface 42w to receive the air W2 exhausted from other louvers (by reducing the resistance to the air W2), it is possible to reduce the moment N2 that causes the louver 42c to close the ventilation hole 42a. In addition, by making it easy for the air receiving surface 42w to receive the air W1 blown from the fan 41 (by increasing the resistance to the air W1), it is possible to increase the moment N1 that causes the louver 42c to open the ventilation hole 42a. This makes it possible to obtain a relatively large moment N1 that causes the louver 42c to open the ventilation hole 42a with a relatively small amount of air flow, reducing the amount of the air W1 desired to turn the blade 42e to open the ventilation hole 42a.

The fan unit 40 may be built using the shutters 42 as illustrated in FIGS. 6A and 6B, and the electronic apparatus 100 including the fan unit 40 as above, as well as the rack cabinet 1 (electronic device or electronic apparatus) with the electronic apparatuses 100 mounted thereon may be built. As described above, the shutter 42 illustrated in FIGS. 6A and 6B reduces the amount of the air W1 desired to open the ventilation hole 42a. Consequently, even if the rotation speed of the fan 41 is lowered, by the control based on the temperature of the external environment, the electronic apparatus 100 or other portions, or in order to reduce the power consumption and noise of the electronic apparatus 100 and the like, it is possible to turn the louver 42c and open the ventilation hole 42a stably.

Next, a second embodiment is described.

Figure 7A:
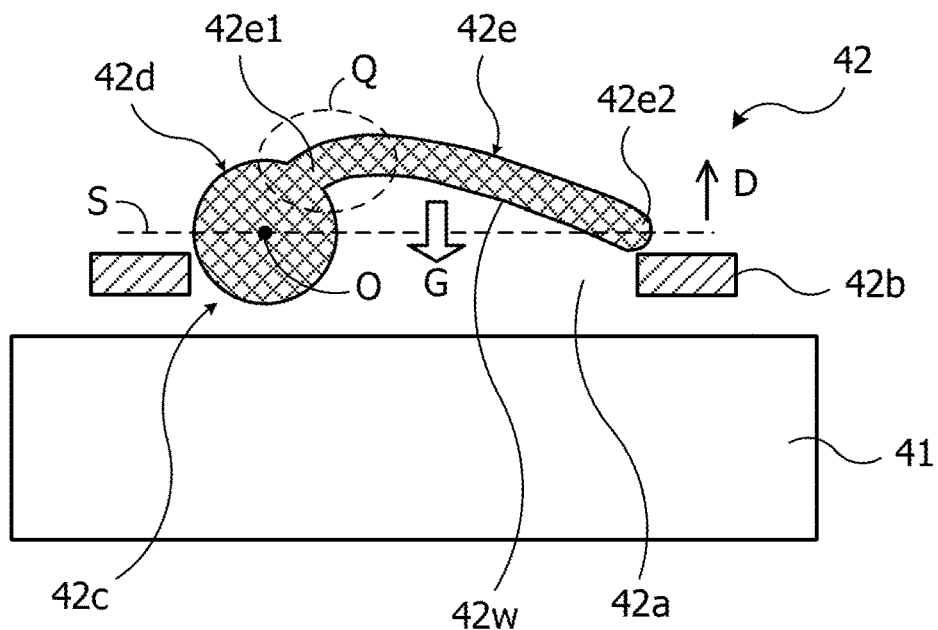
FIGS. 7A and 7B are diagrams illustrating an example of a shutter according to a second embodiment.
Figure 7B:
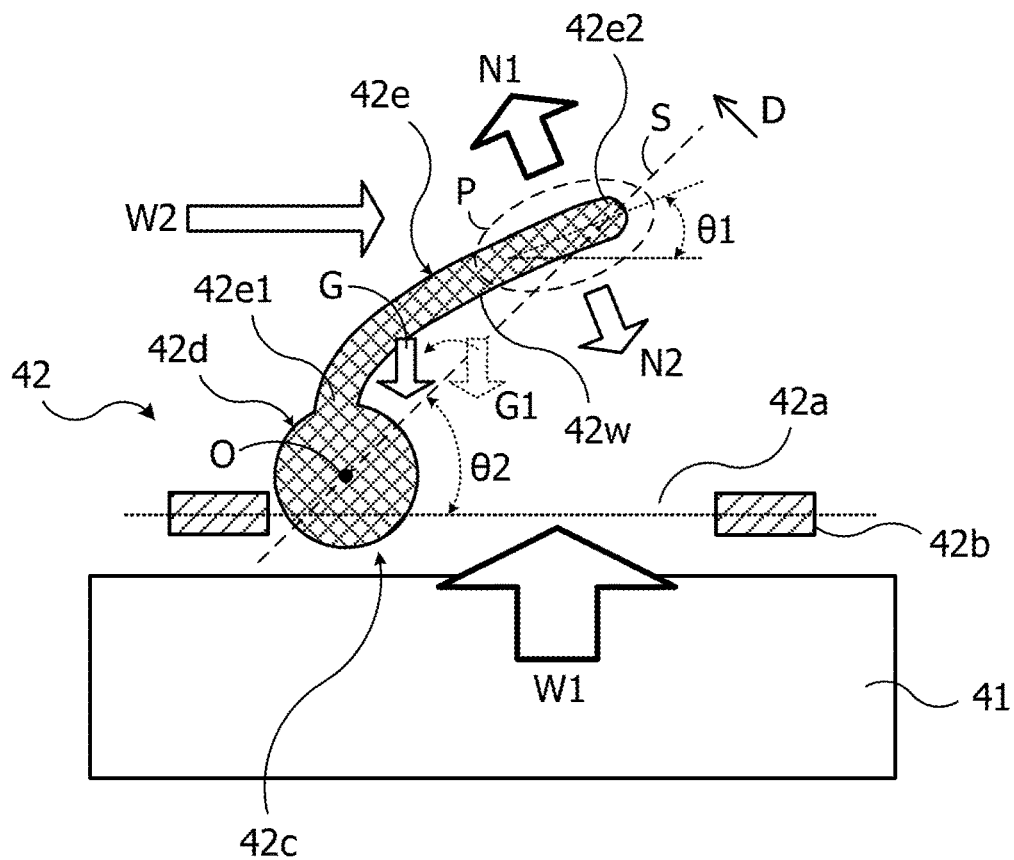

FIGS. 7A and 7B are diagrams illustrating an example of a shutter according to the second embodiment. Here, one louver of the shutter is focused on. FIG. 7A is a schematic cross-sectional view illustrating a main part of the shutter at the time when the louver is closed, and FIG. 7B is a schematic cross-sectional view illustrating the main part of the shutter at the time when the louver is open.

In a louver 42c of the shutter 42 illustrated in FIG. 7A and FIG. 7B, in the same way as described in the first embodiment, a blade 42e has a shape in which an air receiving surface 42w which receives the air W1 blown from the fan 41 and passing through the ventilation hole 42a is a curved surface. In addition, for the louver 42c illustrated in FIGS. 7A and 7B, a connecting portion Q of the blade 42e to a turning portion 42d, in other words, a base 42e1 is shifted in the direction D in which the blade 42e turns to open the ventilation hole 42a, with respect to the plane S connecting the turning axis O and a turning end 42e2.

The fan unit 40 including the shutters 42 as illustrated in FIGS. 7A and 7B and the fans 41 therebelow is disposed above the shelf 20, including the plug-in units 10, of the electronic apparatus 100 (FIG. 1) mounted on the rack cabinet 1 (FIGS. 2A to 4B). The rotation of the fans 41 takes in cool air from the intake duct 31 below the shelf 20 and cools the plug-in units 10. The cooling produces warm air, which is exhausted via the fans 41 and the shutters 42 to the exhaust duct 32.

For the louver 42c illustrated in FIGS. 7A and 7B, since the air receiving surface 42w of the blade 42e is the curved surface, the angle θ1 of the distal end portion P at the time when the blade 42e is turned in the direction D is smaller than the angle θ2 of the foregoing louver 42Ac (FIG. 5B), as described in the above first embodiment. This not only reduces the moment N2 that causes the louver 42c to close the ventilation hole 42a, but also increase the moment N1 that causes the louver 42c to open the ventilation hole 42a, leading to the reduction of the amount of the air W1 desired to open the ventilation hole 42a.

In addition, the louver 42c in which the base 42e1 of the blade 42e is shifted toward the direction D with respect to the plane S as illustrated in FIGS. 7A and 7B reduces the moment N2 in the closing direction at the time when the blade 42e receiving the air W1 turns to open the ventilation hole 42a. Specifically, since the base 42e1 of the blade 42e is shifted in the direction D, the center of gravity of the louver 42c (the own weight G is indicated by a thick arrow of solid lines) is closer to the turning axis O than the center of gravity of the foregoing louver 42Ac of which the air receiving surface 42Aw is flat (the own weight G1 is indicated by a thick arrow of dotted lines). This reduces the moment N2 that is caused by the own weight G of the louver 42c and that causes the louver 42c to close the ventilation hole 42a, and thus reduces the amount of the air W1 to turn the blade 42e desired to open the ventilation hole 42a.

The fan unit 40 may be built using the shutters 42 as illustrated in FIGS. 7A and 7B, and the electronic apparatus 100 including the fan unit 40 as above, as well as the rack cabinet 1 (electronic device or electronic apparatus) with the electronic apparatuses 100 mounted thereon may be built. As described above, in the shutter 42 illustrated in FIGS. 7A and 7B, since the angle θ1 of the distal end portion P of the blade 42e in the louver 42c is reduced, and the base 42e1 is shifted toward the direction D with respect to the plane S, the amount of the air W1 desired to open the ventilation hole 42a is reduced. Consequently, even if the rotation speed of the fan 41 is lower, by the control based on the temperature of the external environment, the electronic apparatus 100 or other portions, or in order to reduce the power consumption and noise of the electronic apparatus 100 and the like, it is possible to turn the louver 42c and open the ventilation hole 42a stably.

Next, a third embodiment is described.

Figure 8A:
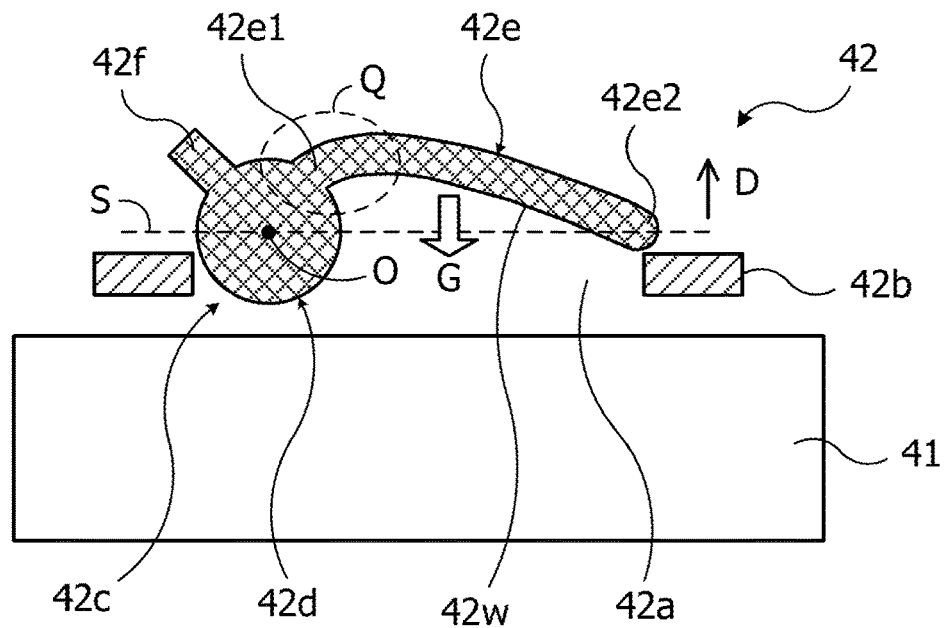
FIGS. 8A and 8B are diagrams illustrating an example of a shutter according to a third embodiment.
Figure 8B:
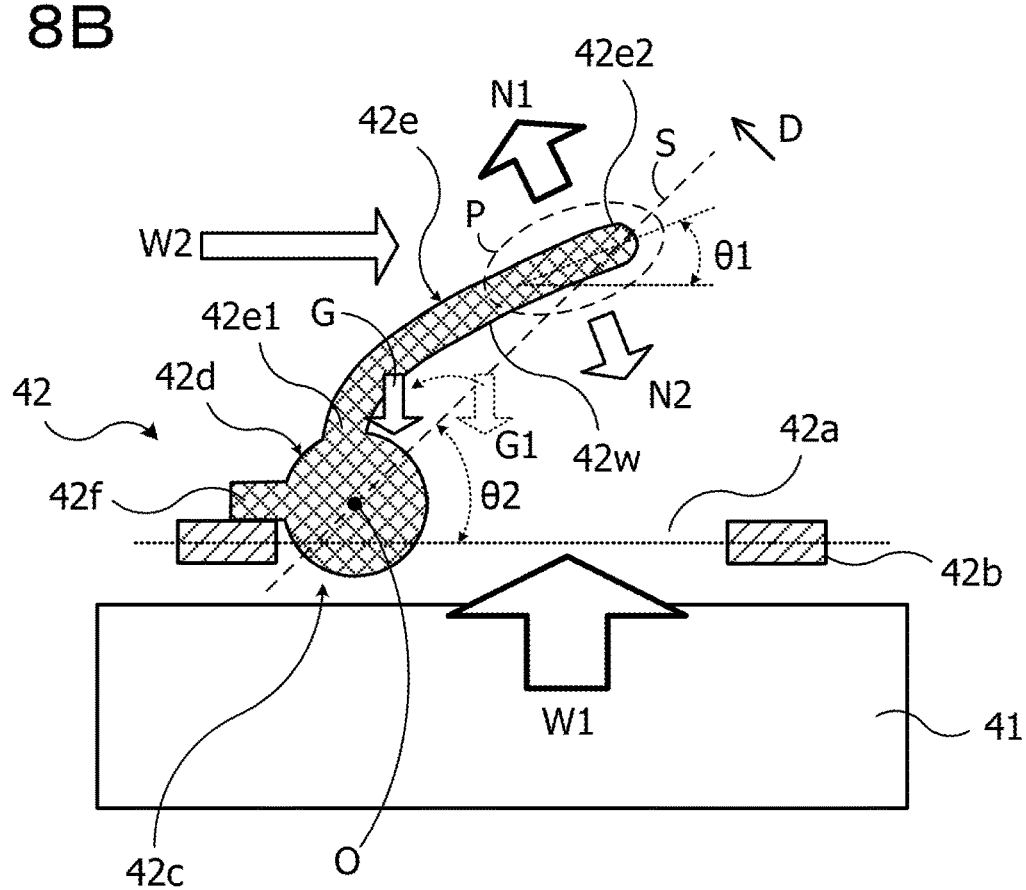

FIGS. 8A and 8B are diagrams illustrating an example of a shutter according to the third embodiment. Here, one louver of the shutter is focused on. FIG. 8A is a schematic cross-sectional view illustrating a main part of the shutter at the time when the louver is closed, and FIG. 8B is a schematic cross-sectional view illustrating the main part of the shutter at the time when the louver is open.

In a louver 42c of the shutter 42 illustrated in FIGS. 8A and 8B, in the same way as described in the first embodiment, a blade 42e has a shape in which an air receiving surface 42w which receives the air W1 blown from the fan 41 and passing through the ventilation hole 42a is a curved surface. In addition, for the louver 42c illustrated in FIGS. 8A and 8B, a base 42e1 which is a connecting portion Q of the blade 42e to a turning portion 42d is shifted toward the direction D in which the blade 42e turns to open the ventilation hole 42a, with respect to the plane S connecting the turning axis O and a turning end 42e2. In addition, the louver 42c illustrated in FIGS. 8A and 8B has a protrusion 42f formed at the turning portion 42d. The material for the protrusion 42f is the same as or different from that for the turning portion 42d. The protrusion 42f is formed, for example, as illustrated in FIG. 8B, so as to contact the base 42b when the louver 42c turns to open the ventilation hole 42a.

The fan unit 40 including the shutters 42 as illustrated in FIGS. 8A and 8B and the fans 41 therebelow is disposed above the shelf 20, including the plug-in units 10, of the electronic apparatus 100 (FIG. 1) mounted on the rack cabinet 1 (FIGS. 2A to 4B). The rotation of the fans 41 takes in cool air from the intake duct 31 below the shelf 20 and cools the plug-in units 10. The cooling produces warm air, which is exhausted via the fans 41 and the shutters 42 to the exhaust duct 32.

For the louver 42c illustrated in FIGS. 8A and 8B, since the air receiving surface 42w of the blade 42e is the curved surface, and the angle θ1 of the distal end portion P at the time when the blade 42e is turned in the direction D is reduced, the moment N2 in the closing direction is reduced, and the moment N1 in the opening direction is increased. This reduces the amount of the air W1 desired to open the ventilation hole 42a.

In addition, for the louver 42c illustrated in FIGS. 8A and 8B, shifting the base 42e1 of the blade 42e toward the direction D with respect to the plane S makes the center of gravity of the louver 42c which is turned to open the ventilation hole 42a, closer to the turning axis O, and thus reduces the moment N2 in the closing direction. This reduces the amount of the air W1 desired to open the ventilation hole 42a.

Further, for the louver 42c illustrated in FIGS. 8A and 8B, forming the protrusion 42f at the turning portion 42d makes the center of gravity of the louver 42c which is turned to open the ventilation hole 42a, much closer to the turning axis O. This reduces the moment N2 in the closing direction, reducing the amount of the air W1 desired to open the ventilation hole 42a. Here, for example, if the protrusion 42f is configured to contact the base 42b when the louver 42c is turned to open the ventilation hole 42a, as illustrated in FIG. 8B, the protrusion 42f may be utilized as a stopper which keeps the louver 42c from opening excessively.

The fan unit 40 may be built using the shutters 42 as illustrated in FIGS. 8A and 8B, and the electronic apparatus 100 including the fan unit 40 as above, as well as the rack cabinet 1 (electronic device or electronic apparatus) with the electronic apparatuses 100 mounted thereon may be built. As described above, in the shutter 42 illustrated in FIGS. 8A and 8B, the angle θ1 of the distal end portion P of the blade 42e in the louver 42c is reduced, the base 42e1 is shifted toward the direction D with respect to the plane S, and in addition, the protrusion 42f is formed at the turning portion 42d. This reduces the amount of the air W1 desired to open the ventilation hole 42a. Consequently, even if the rotation speed of the fan 41 is lowered, by the control based on the temperature of the external environment, the electronic apparatus 100 or other portions, or in order to reduce the power consumption and noise of the electronic apparatus 100 and the like, it is possible to turn the louver 42c and open the ventilation hole 42a stably.

As described above, in the shutter 42 illustrated in FIGS. 8A and 8B, the protrusion 42f is formed at the turning portion 42d of the louver 42c. Here, the protrusion 42f is further described.

Figure 9A:
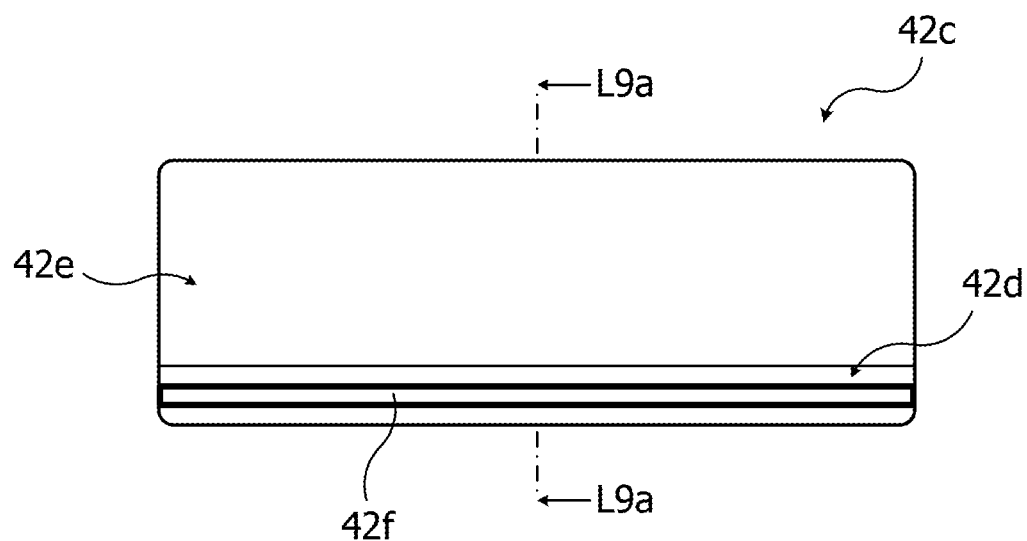
FIGS. 9A and 9B are diagrams each illustrating an example of a louver according to the third embodiment.
Figure 9B:
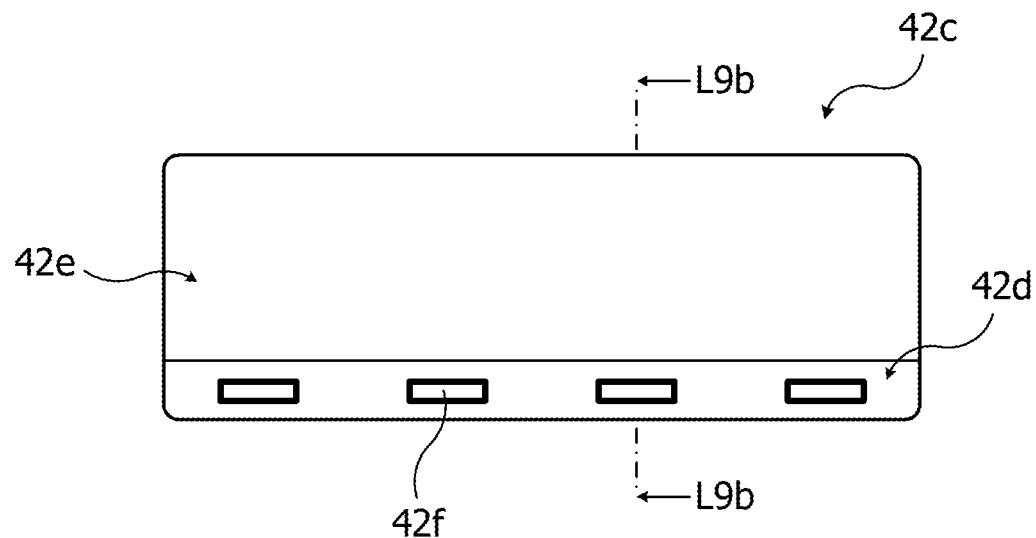

FIGS. 9A and 9B are diagrams each illustrating an example of the louver according to the third embodiment. FIGS. 9A and 9B are schematic plan views each illustrating a main part of the example of the louver.

The protrusion 42f formed at the turning portion 42d of the louver 42c, for example, continuously extends between the side edges of the louver 42c (between both ends in the axis direction of the turning portion 42d), as illustrated in FIG. 9A. Alternatively, the protrusion 42f formed at the turning portion 42d of the louver 42c is, for example, separated at multiple locations between the side edges of the louver 42c as illustrated in FIG. 9B. Note that the cross-section of the louver 42c illustrated in FIGS. 8A and 8B above corresponds to the cross-section along line L9a-L9a in FIG. 9A or the cross-section along line L9b-L9b in FIG. 9B.

In either case of the protrusion 42f illustrated in FIG. 9A or the protrusion 42f in FIG. 9B, the center of gravity of the louver 42c which is turned to open the ventilation hole 42a is closer to the turning axis O than in the case where the turning portion 42d does not have the protrusion 42f. The protrusion 42f illustrated in FIG. 9A makes the weight be applied at a position closer to the turning portion 42d, than the protrusion 42f illustrated in FIG. 9B. In light of the above point, the number and positions of the protrusions 42f formed at the turning portion 42d may be adjusted to adjust the weight applied on the turning portion 42d side at the time when the louver 42c is turned, based on the weight of the blade 42e of the louver 42c, the amount of the air W1 from the fan 41, the amount of the air W2 from other louvers, and other factors. In addition, the size, the material, and the like of the protrusion 42f may be changed to adjust the weight applied on the turning portion 42d side at the time when the louver 42c is turned.

Next, a fourth embodiment is described.

Figure 10A:
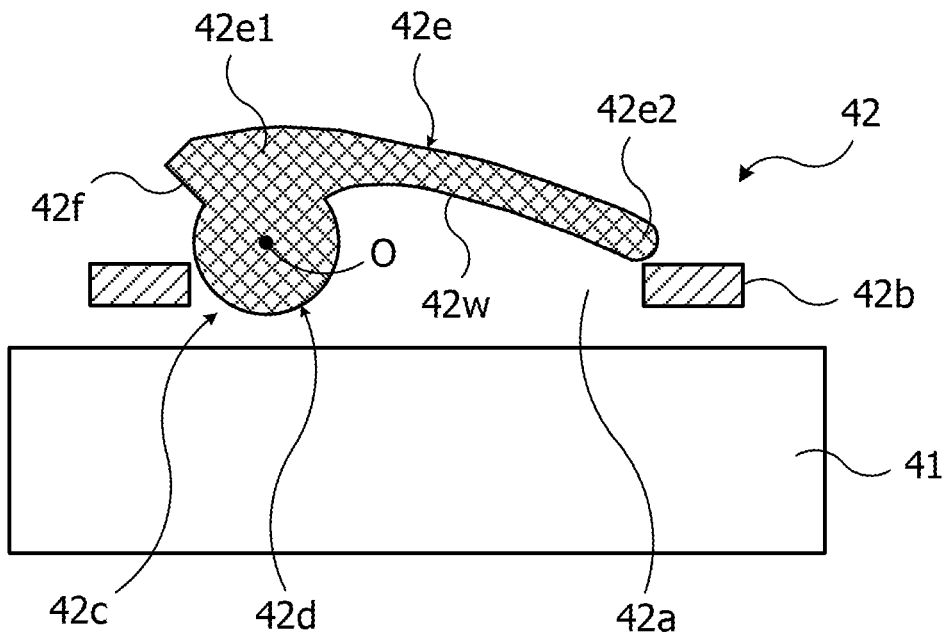
FIGS. 10A and 10B are diagrams illustrating an example of a shutter according to a fourth embodiment.
Figure 10B:
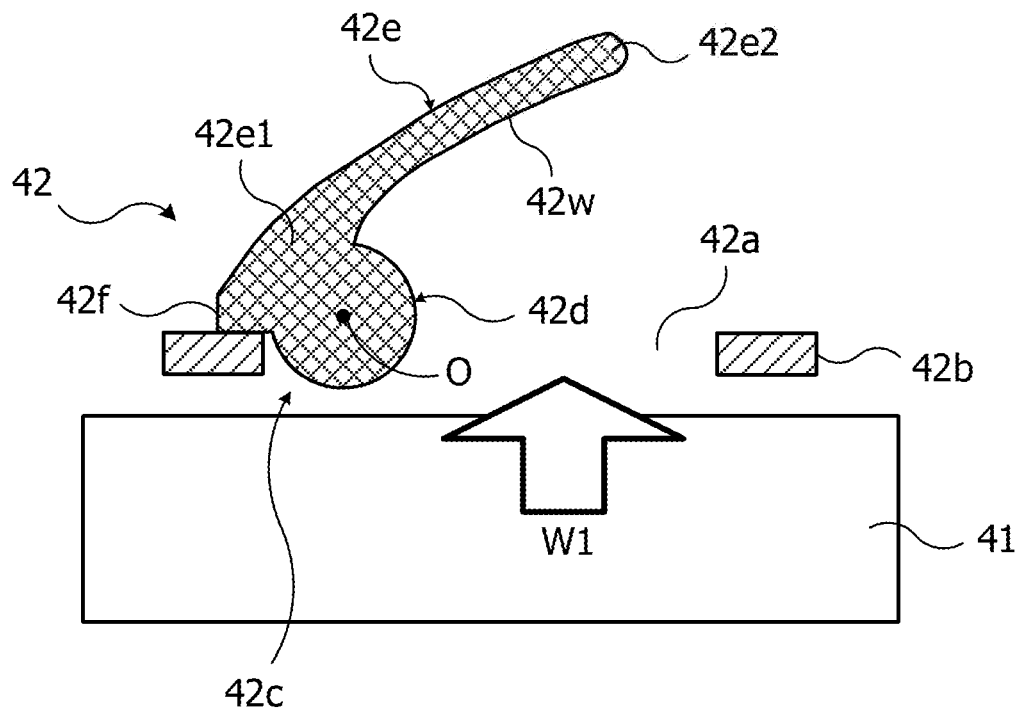
Figure 11A:
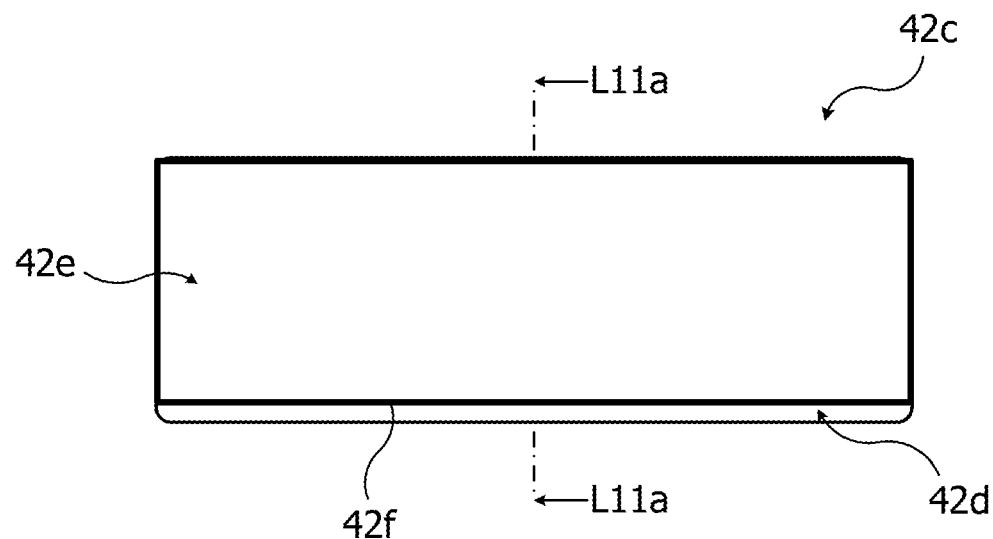
FIGS. 11A and 11B are diagrams each illustrating an example of a louver according to the fourth embodiment.
Figure 11B:
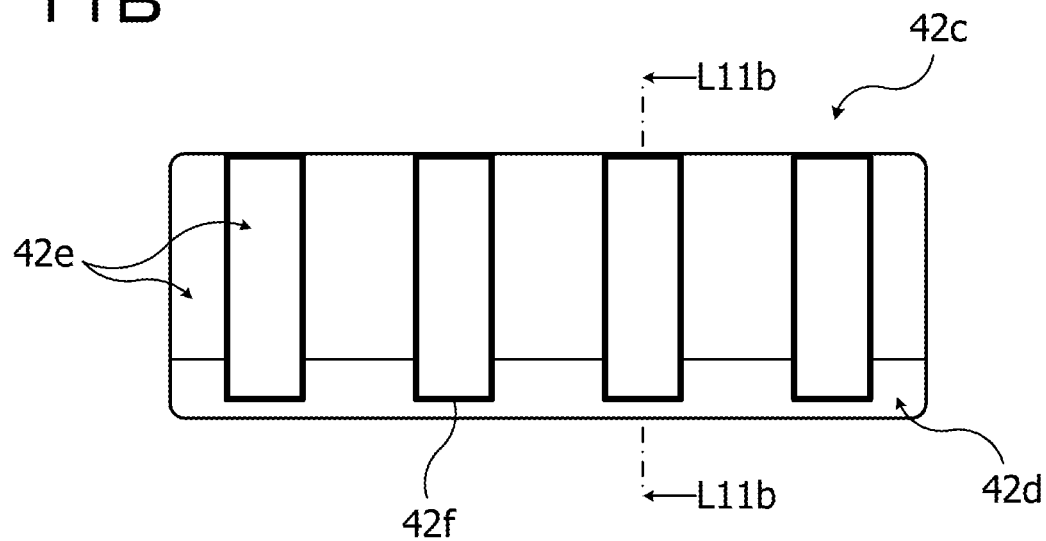

FIGS. 10A and 10B are diagrams illustrating an example of a shutter according to the fourth embodiment. Here, one louver of the shutter is focused on. FIG. 10A is a schematic cross-sectional view illustrating a main part of the shutter at the time when the louver is closed, and FIG. 10B is a schematic cross-sectional view illustrating the main part of the shutter at the time when the louver is open. In addition, FIGS. 11A and 11B are diagrams each illustrating an example of the louver according to the fourth embodiment. FIGS. 11A and 11B are schematic plan views each illustrating a main part of an example of the louver.

The shutter 42 illustrated in FIGS. 10A and 10B is different from the shutter 42 described in the foregoing third embodiment (FIGS. 8A to 9B) in that a blade 42e of a louver 42c is integrated with a protrusion 42f formed at a turning portion 42d.

The portion of the blade 42e integrated with the protrusion 42f is formed, for example, to continuously extend between the side edges of the louver 42c as illustrated in FIG. 11A. Alternatively, the portion of the blade 42e integrated with the protrusion 42f is formed, for example, to be separated at multiple locations between the side edges of the louver 42c as illustrated in FIG. 11B. Note that the cross-sections of the louver 42c illustrated in FIGS. 10A and 10B above correspond to the cross-section along line L11a-L11a in FIG. 11A or the cross-section along line L11b-L11b in FIG. 11B.

The fan unit 40 including the shutters 42 as illustrated in FIGS. 10A and 10B and FIG. 11A or 11B and the fans 41 therebelow is disposed above the shelf 20, including the plug-in units 10, of the electronic apparatus 100 (FIG. 1) mounted on the rack cabinet 1 (FIGS. 2A to 4B).

In the shutter 42 illustrated in FIGS. 10A and 10B, the blade 42e of the louver 42c is formed to be thicker at a base 42e1 than at a turning end 42e2 entirely or partially. This base 42e1 formed to be thick functions as the protrusion 42f (in the same way as the protrusion 42f described in the foregoing third embodiment). The base 42e1 of the blade 42e integrated with the protrusion 42f is formed, for example, to contact the base 42b when the louver 42c turns to open the ventilation hole 42a, as illustrated in FIG. 10B.

In the same way as described in the foregoing third embodiment, also in the louver 42c illustrated in these FIGS. 10A and 10B and FIG. 11A or FIG. 11B, the blade 42e integrated with the protrusion 42f makes the center of gravity of the turned louver 42c closer to the turning axis O. This reduces the moment in the closing direction, and thus reduces the amount of the air W1 desired to open the ventilation hole 42a. In addition, if the protrusion 42f (the base 42e1 of the blade 42e) is configured to contact the base 42b when the louver 42c turns, the protrusion 42f may be utilized as a stopper which keeps the louver 42c from opening excessively.

In the louver 42c as illustrated in FIGS. 10A and 10B, and FIG. 11A or 11B, integrating the blade 42e with the protrusion 42f forms the thick portion, which increases the strength of the louver 42c (in particular, of the blade 42e). If the portion integrated with the protrusion 42f of the blade 42e is partially formed on the louver 42c, it is possible to increase the strength of the louver 42c (in particular, of the blade 42e) while controlling the increase of the weight thereof.

The fan unit 40 may be built using the shutters 42 as illustrated in FIGS. 10A and 10B, and FIG. 11A or 11B and the electronic apparatus 100 including the fan unit 40 as above, as well as the rack cabinet 1 (electronic device or electronic apparatus) with the electronic apparatuses 100 mounted thereon may be built. In the shutter 42 illustrated in FIGS. 10A and 10B, and FIG. 11A or 11B, the blade 42e of the louver 42c has the curved air receiving surface 42w, and the base 42e1 of the blade 42e is shifted and integrated with the protrusion 42f. This reduces the amount of the air W1 desired to open the ventilation hole 42a while increasing the strength of the louver 42c. Consequently, even if the rotation speed of the fan 41 is lowered, by the control based on the temperature of the external environment, the electronic apparatus 100 or other portions, or in order to reduce the power consumption and noise of the electronic apparatus 100 and the like, it is possible to turn the louver 42c while keeping its shape, and open the ventilation hole 42a stably.

Next, a fifth embodiment is described.

Figure 12A:
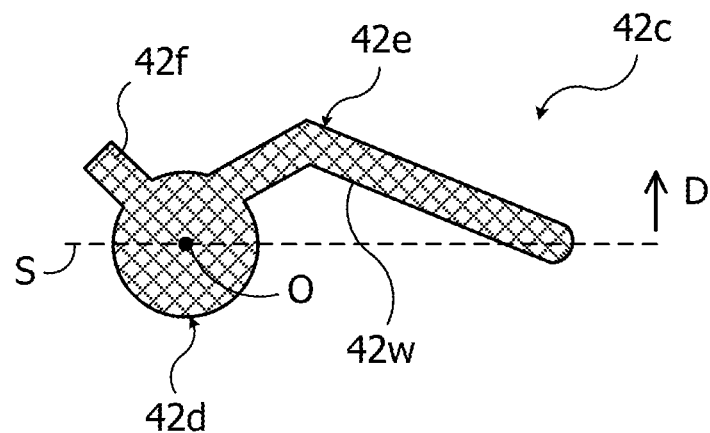
FIGS. 12A, 12B, and 12C are diagrams each illustrating an example of a louver according to a fifth embodiment.
Figure 12B:
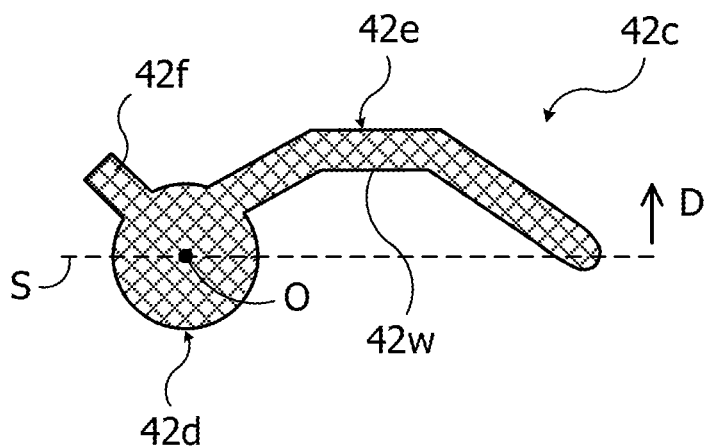
Figure 12C:
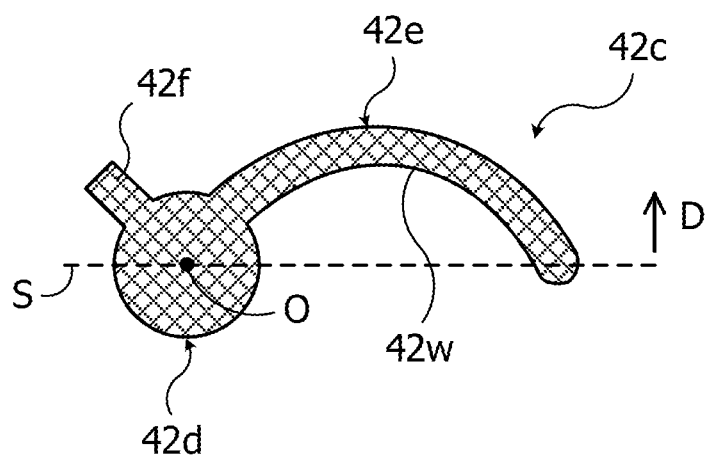

FIGS. 12A to 12C are diagrams each illustrating an example of a louver according to the fifth embodiment. FIGS. 12A to 12C are schematic cross-sectional views each illustrating a main part of an example of a louver.

Each of the shapes of the blades 42e included in the louvers 42c of the shutters 42 described in the foregoing first to fourth embodiments is an example, and various shapes having a curved air receiving surface 42w may be employed.

For example, the louver 42c described in the foregoing third embodiment may be modified into one including a blade 42e having a shape illustrated in one of FIGS. 12A to 12C. Here, a blade 42e of a louver 42c illustrated in FIG. 12A has a shape in which the air receiving surface 42w is a curved surface including two flat surfaces which have different gradients and continue to each other. A blade 42e of a louver 42c illustrated in FIG. 12B has a shape in which the air receiving surface 42w is a curved surface including three flat surfaces which have different gradients and continue to one another. The number of flat surfaces forming the air receiving surface 42w is not limited to these examples, but four or more flat surfaces may form the air receiving surface 42w. In addition, a blade 42e of a louver 42c illustrated in FIG. 12C has a shape in which the air receiving surface 42w is an arcuate curved shape. Examples of the curves surface employed for the air receiving surface 42w include a curved surface which is curved like a quadratic curve or a spline curve, or a curved surface including multiple such curved surfaces continuing one another is employed. Besides, as for the blade 42e of the louver 42c, the air receiving surface 42w may be a curved surface combining one or more flat surfaces and one or more curved surfaces which continue to one another.

Here, although the louver 42c described in the foregoing third embodiment is taken as an example, the blade 42e of the louver 42c described in the foregoing first or second embodiment may be modified into a blade 42e in a shape having an air receiving surface 42w as illustrated in FIGS. 12A to 12C and the like. In addition, the blade 42e of the louver 42c described in the foregoing fourth embodiment may be modified into a blade 42e in a shape having an air receiving surface 42w as illustrated in FIGS. 12A to 12C and the like, and integrated with the protrusion 42f.

Next, a sixth embodiment is described.

Figure 13A:
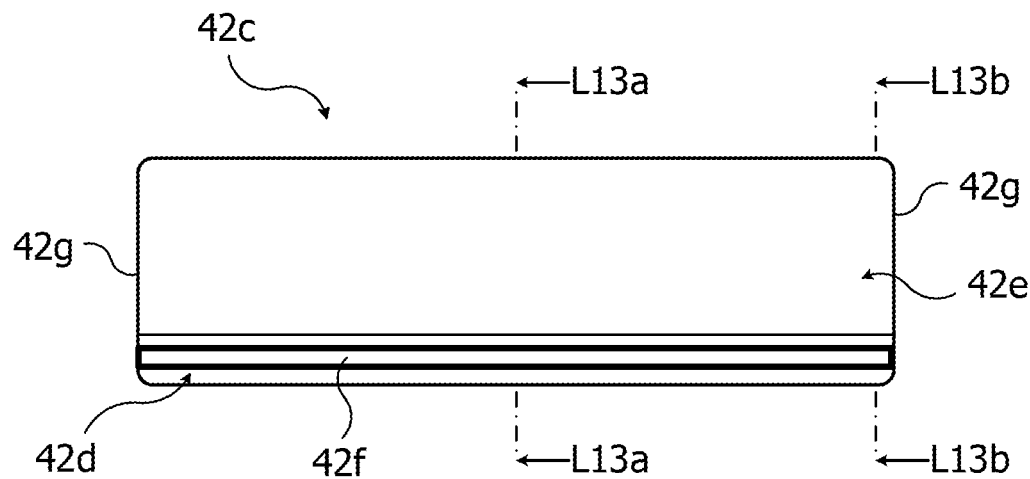
FIGS. 13A, 13B, and 13C are diagrams illustrating an example of a louver according to a sixth embodiment.
Figure 13B:
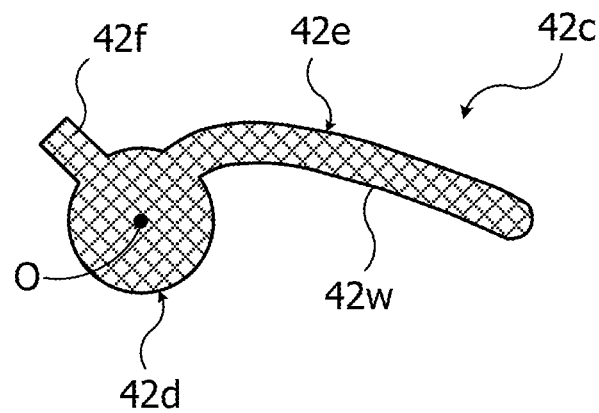
Figure 13C:
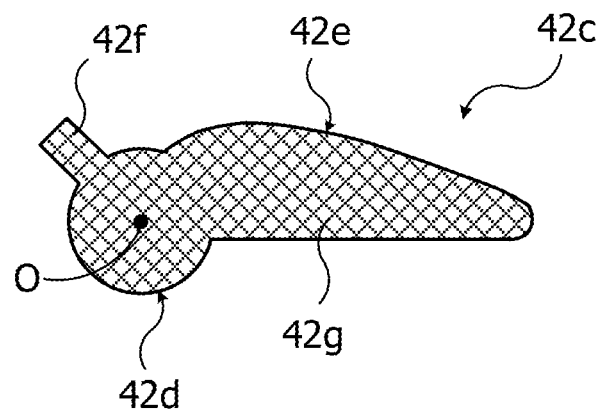

FIGS. 13A to 13C are diagrams illustrating an example of a louver according to the sixth embodiment. FIG. 13A is a schematic plan view illustrating a main part of an example of a louver, FIG. 13B is a schematic cross-sectional view taken along line L13a-L13a in FIG. 13A, and FIG. 13C is a schematic cross-sectional view taken along line L13b-L13b in FIG. 13A.

A louver 42c illustrated in illustrated in FIGS. 13A to 13C is different from the louver 42c described in the foregoing third embodiment (FIGS. 8A and 8B, and FIG. 9A as an example) in that side walls 42g are formed on the both sides of a turning portion 42d in the axis direction. The side wall 42g of the louver 42c may be formed, for example, continuously from a blade 42e to the turning portion 42d, as illustrated in FIG. 13C. Besides this, although illustration is omitted here, multiple side walls 42g may be formed separately on each side of the louver 42c in light of weight reduction of the louver 42c.

Forming the side walls 42g inhibits the air received by the air receiving surface 42w (the air passing through the foregoing ventilation hole 42a) from escaping to the sides (in both sides in the axis direction), and it also reduces turbulence of flow caused by air entering from the sides, increasing the air pressure on the air receiving surface 42w. In addition, forming the side walls 42g increases the strength of the louver 42c.

Here, although the louver 42c described in the foregoing third embodiment is taken as an example, the side walls 42g may be formed on the louver 42c described in the foregoing first, second, fourth, and fifth embodiments, or the like, following this example of FIGS. 13A to 13C.

Next, a seventh embodiment is described.

Figure 14A:
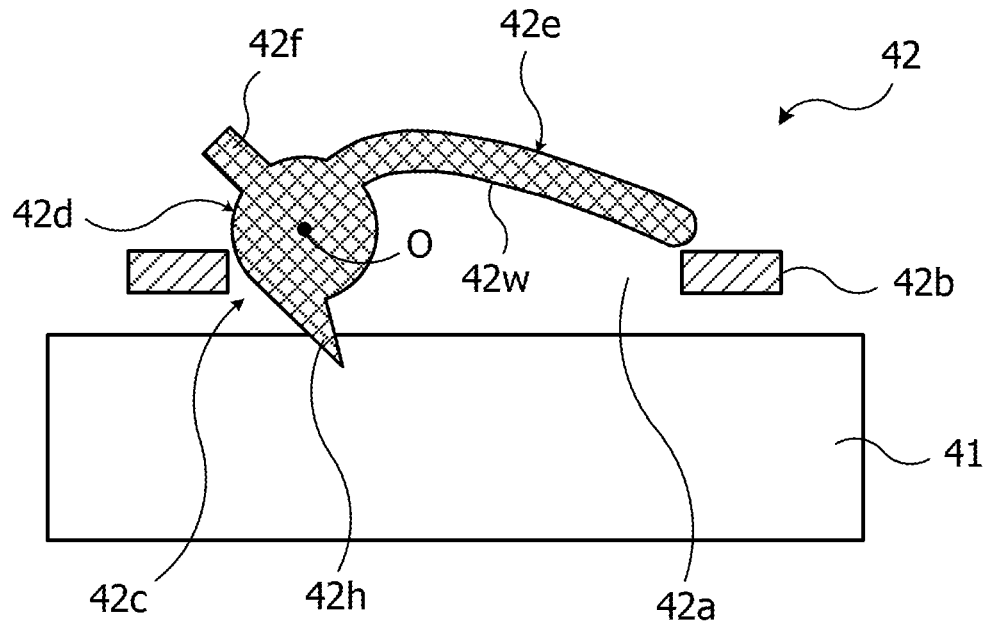
FIGS. 14A and 14B are diagrams illustrating a first example of a shutter according to a seventh embodiment.
Figure 14B:
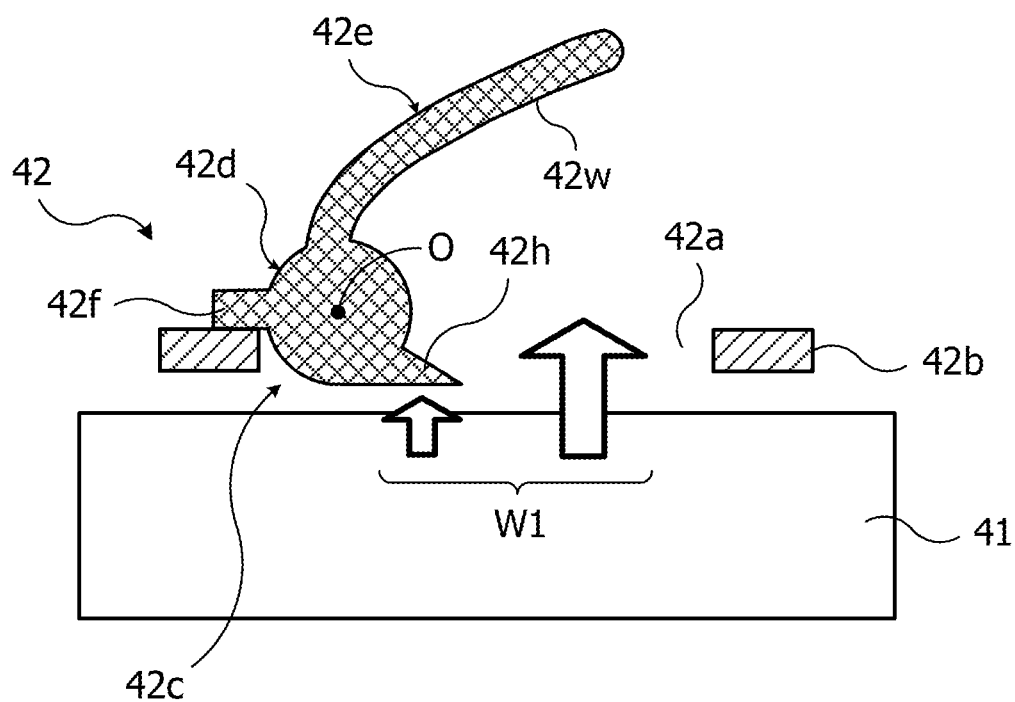

FIGS. 14A and 14B are diagrams illustrating a first example of a shutter according to the seventh embodiment. Here, one louver of the shutter is focused on. FIG. 14A is a schematic cross-sectional view illustrating a main part of the shutter at the time when the louver is closed, and FIG. 14B is a schematic cross-sectional view illustrating the main part of the shutter at the time when the louver is open.

The shutter 42 illustrated in FIGS. 14A and 14B is different from the shutter 42 described in the foregoing third embodiment (FIGS. 8A to 9B) in that an air receiving portion 42h which receives the air W1 blown into the ventilation hole 42a is formed at a turning portion 42d of the louver 42c. The material used for the air receiving portion 42h is the same as or different from that for the turning portion 42d.

As illustrated in FIG. 14A, when the louver 42c closes the ventilation hole 42a by its own weight, the air receiving portion 42h formed at the turning portion 42d protrudes to the fan 41 side, and as illustrated in FIG. 14B, when the blade 42e is turned by receiving the air W1, the air receiving portion 42h receives the air W1 from the fan 41. The turned louver 42c receives the air W1 at the air receiving surface 42w of the blade 42e and also receives the air W1 at the air receiving portion 42h of the turning portion 42d.

As described above, the louver 42c illustrated in FIGS. 14A and 14B receives the air W1 not only with the air receiving surface 42w of the blade 42e but also with the air receiving portion 42h of the turning portion 42d, and thus the louver 42c receives more air W1, making it possible to open the ventilation hole 42a with a smaller amount of the air W1.

Figure 15A:
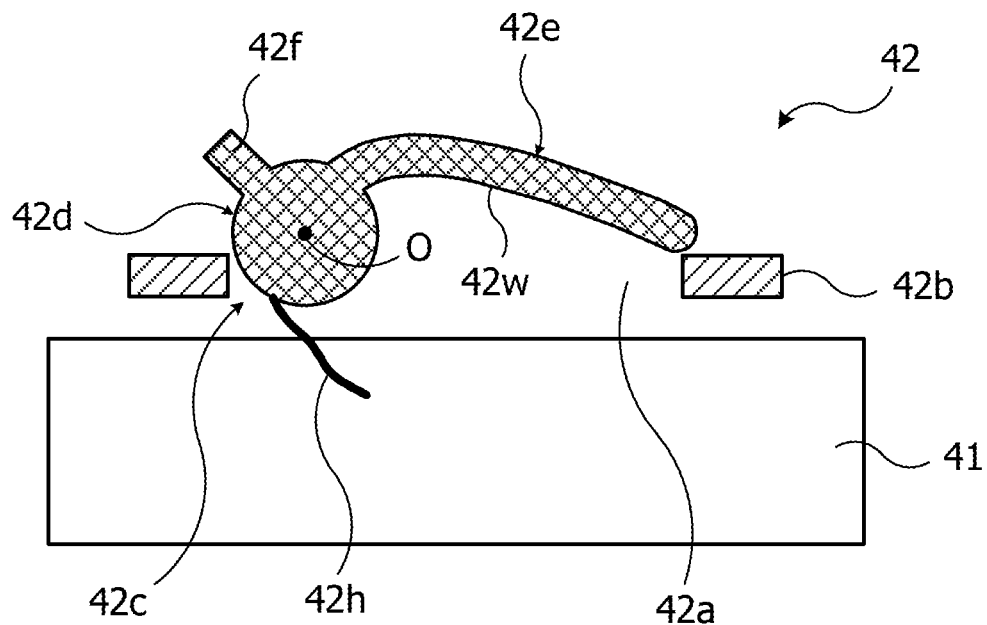
FIGS. 15A and 15B are diagrams illustrating a second example of a shutter according to the seventh embodiment.
Figure 15B:
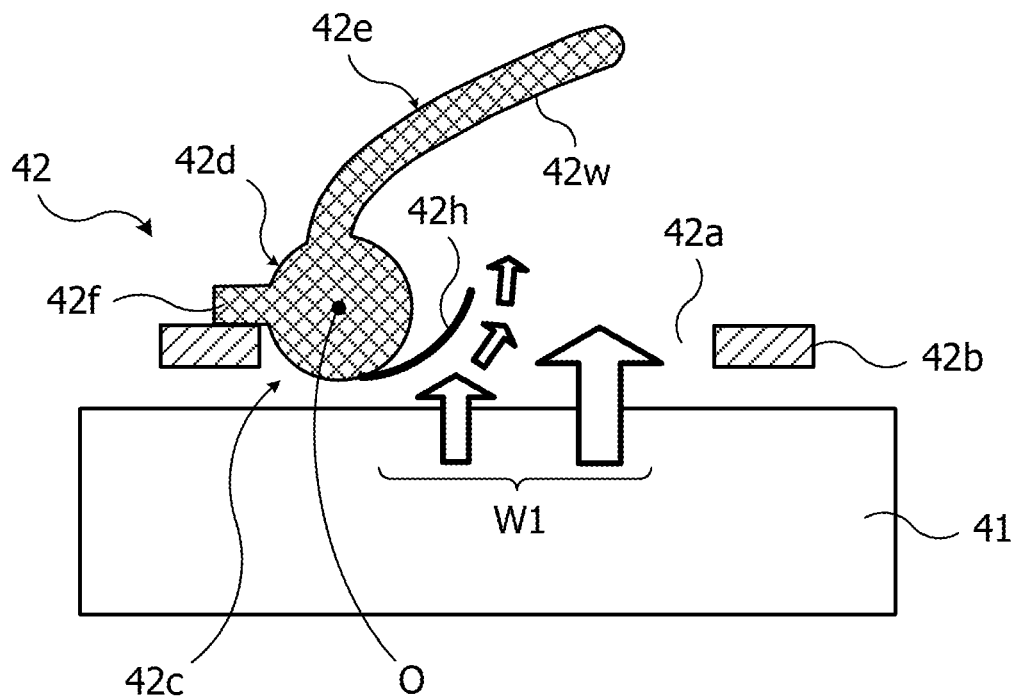
Figure 16A:
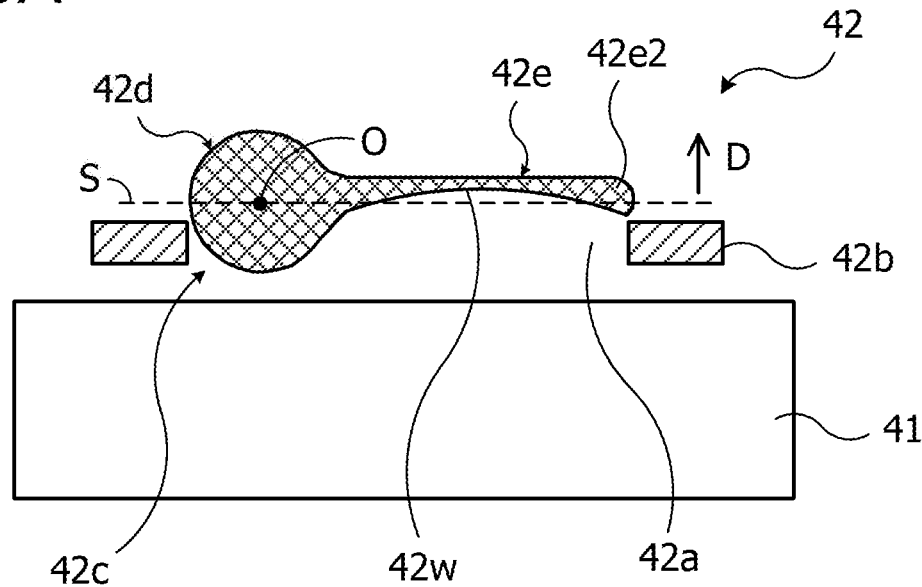
FIGS. 16A and 16B are diagrams illustrating an example of a shutter according to an eighth embodiment.
Figure 16B:
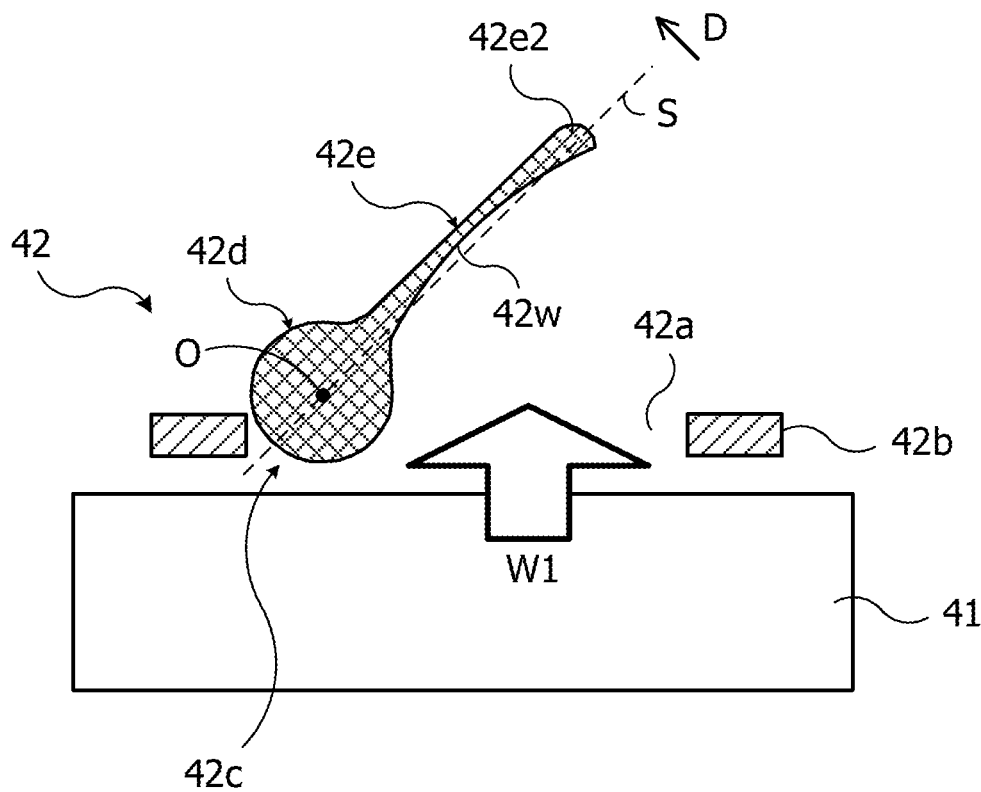

FIGS. 15A and 16B are diagrams illustrating a second example of a shutter according to the seventh embodiment. Here, one louver of the shutter is focused on. FIG. 15A is a schematic cross-sectional view illustrating a main part of the shutter at the time when the louver is closed, and FIG. 15B is a schematic cross-sectional view illustrating the main part of the shutter at the time when the louver is open.

The shutter 42 illustrated in FIGS. 15A and 15B is different from the foregoing first example (FIGS. 14A and 14B) in that a flexible sheet-shaped air receiving portion 42h is formed at a turning portion 42d of the louver 42c. This sheet-shaped air receiving portion 42h may be made of various flexible materials, for example, a resin material which is the same as or different from one used for the turning portion 42d or the like.

Also with this sheet-shaped air receiving portion 42h, when the louver 42c is turned by receiving the air W1, the louver 42c receives the air W1 not only with the air receiving surface 42w of the blade 42e but also with the sheet-shaped air receiving portion 42h at the turning portion 42d. This makes it possible to open the ventilation hole 42a with a small amount of the air W1. In addition, as illustrated in FIG. 15B, the sheet-shaped air receiving portion 42h receives the air W1 and bends in the downstream direction, allowing the air W1 to flow along it. This makes it easier for warm air W1 from the fan 41 to be exhausted to the outside of the ventilation hole 42a.

Here, although the louver 42c described in the foregoing third embodiment is taken as an example, the air receiving portion 42h may also be formed on the louver 42c described in the foregoing first, second, and fourth to sixth embodiments, or the like, following the examples in FIGS. 14A and 14B, and FIGS. 15A and 15B.

Next, an eighth embodiment is described.

FIGS. 16A and 16B are diagrams illustrating an example of a shutter according to the eighth embodiment. Here, one louver of the shutter is focused on. FIG. 16A is a schematic cross-sectional view illustrating a main part of the shutter at the time when the louver is closed, and FIG. 16B is a schematic cross-sectional view illustrating the main part of the shutter at the time when the louver is open.

The shutter 42 illustrated in FIGS. 16A and 16B uses a blade 42e of a louver 42c in which a curved recess is formed on a surface of a flat plate, the surface receiving the air W1 from the fan 41, and the surface of the recess is an air receiving surface 42w. The surface of the recess which is the air receiving surface 42w has a curved surface which is recessed toward the direction D in which the blade 42e is turned to open the ventilation hole 42a, with respect to the plane S connecting the turning axis O and the turning end 42e2. The air receiving surface 42w being the surface of the recess makes it easy to receive the air W1 from the fan 41, increasing the moment in the opening direction, compared to the case where the air receiving surface is flat (the air receiving surface 42Aw in the foregoing FIG. 5B). This makes it possible to reduce the amount of the air W1 desired to open the ventilation hole 42a.

In this louver 42c in which the air receiving surface 42w is the surface of the recess as above, too, the connecting portion of the blade 42e to the turning portion 42d may be shifted toward the direction D with respect to the plane S, following the example described in the foregoing second embodiment. In addition, following the example described in the foregoing third embodiment, a protrusion 42f may be formed at the turning portion 42d, and following the example described in the foregoing fourth embodiment, the blade 42e may be integrated with the protrusion 42f formed at the turning portion 42d. Further, following the example described in the foregoing sixth embodiment, side walls 42g may be formed on the blade 42e, and following the example described in the foregoing seventh embodiment, an air receiving portion 42h may be formed at the turning portion 42d.

Next, a ninth embodiment is described.

Figure 17A:
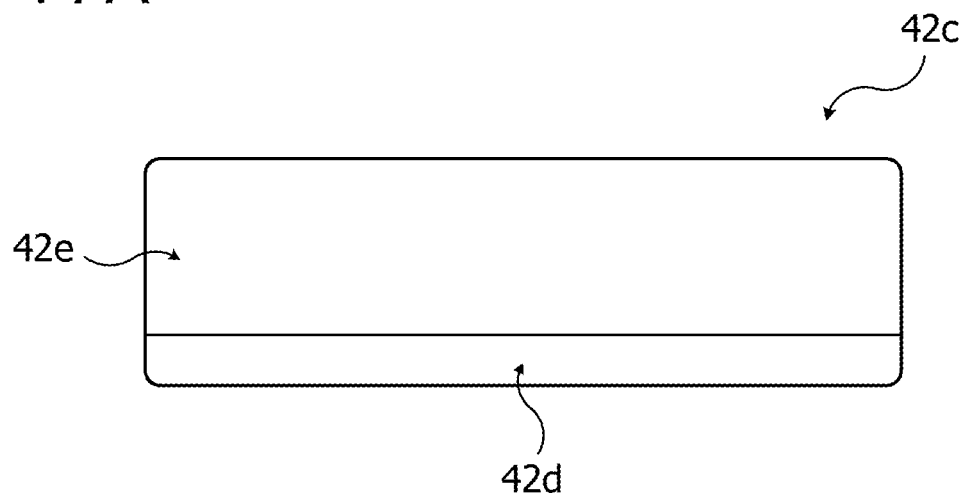
FIGS. 17A, 17B, and 17C are diagrams illustrating an example of a louver according to a ninth embodiment.
Figure 17B:
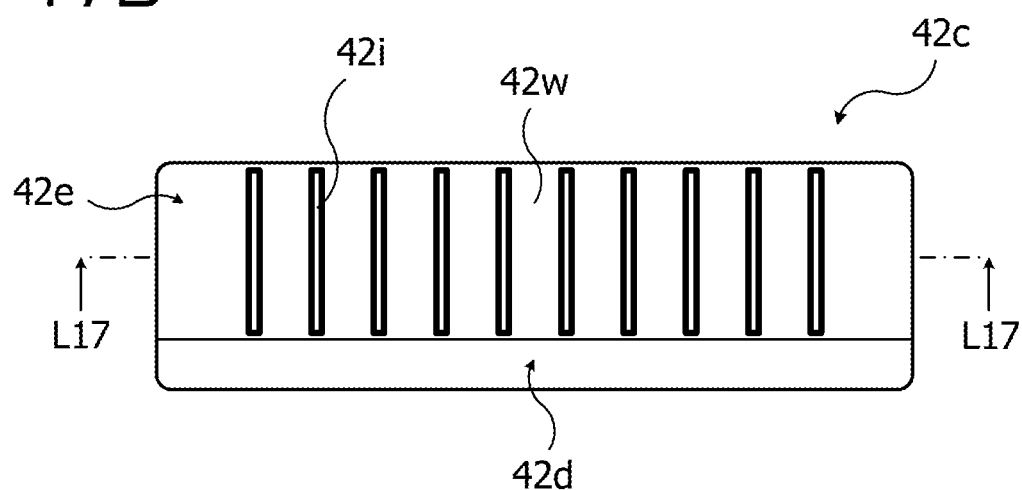
Figure 17C:
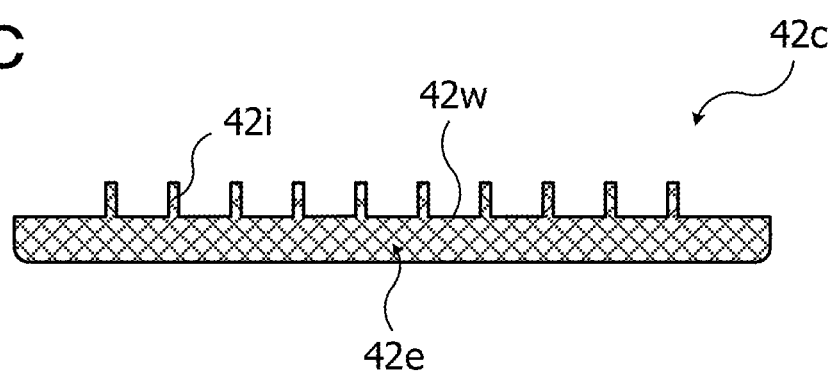

FIGS. 17A to 17C are diagrams illustrating an example of a louver according to the ninth embodiment. FIG. 17A is a schematic plan view illustrating a main part of the example of the louver, viewed from the opposite side from the air receiving surface, FIG. 17B is a schematic plan view illustrating a main part of the example of the louver, viewed from the air receiving surface side, and FIG. 17C is a schematic cross-sectional view taken along line L17-L17 in FIG. 17B.

The louver 42c illustrated in FIGS. 17A to 17C has a structure in which at least one rib 42i extending in a direction orthogonal to the axis direction of the turning portion 42d is formed on the air receiving surface 42w which receives air from the fan 41. Here, ten parallel ribs 42i are formed as an example. Note that in the case where the ribs 42i are formed on the air receiving surface 42w, it is preferable that the ribs 42i extend in a direction orthogonal to the axis direction of the turning portion 42d in order not to disturb the receiving air flow.

Forming the ribs 42i in the louver 42c increases the strength of the louver 42c. Alternatively, forming the ribs 42i in louver 42c makes it possible to reduce the thickness to achieve weight reduction of the louver 42c while keeping certain strength.

For example, assuming that the louver 42c is 50 mm in width and 5 mm in length, if the thickness is reduced from 1.0 mm to 0.8 mm, and ten ribs 42i with a width of 0.5 mm and a height of 0.5 mm are added, the volume is reduced by 15% as follows.

{(50 mm×5 mm×0.8 mm)+(0.5 mm×0.5 mm×5 mm× 10)}/(50 mm×5 mm×1.0 mm)=0.85

Although, here, forming the ribs 42i on the air receiving surface 42w is illustrated as an example, the ribs 42i may be formed on the opposite surface from the air receiving surface 42w (corresponding to the surface illustrated in FIG. 17A), or may be formed on both the air receiving surface 42w and the opposite surface therefrom. These structures also make it possible to increase the strength of the louver 42c or achieve weight reduction of the louver 42c while keeping the strength thereof.

As for the louver 42c described in the foregoing first to eighth embodiments, or the like, at least one rib 42i as described in the ninth embodiment is formed on at least one of the air receiving surface 42w and the opposite surface therefrom. This makes it possible to increase the strength of the louver 42c described in the foregoing first to eighth embodiments, or the like, or achieve the weight reduction thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A shutter comprising:
   a base that has a ventilation hole; and
   a louver that is attached to the base and opens and closes the ventilation hole, the louver includes
   a turning portion pivotally and turnably supported on the base, and
   a blade coupled to the turning portion at a first end, the blade turns about a turning axis of the turning portion to open the ventilation hole by receiving air passing through the ventilation hole, and
   the blade has a shape in which an air receiving surface which receives the air is curved toward a direction in which the blade turns to open the ventilation hole, with respect to a plane which couples the turning axis and a turning end of the blade,
   the turning portion includes an air receiving portion coupled to the turning portion at a second end opposite to the first end, with respect to the turning axis in a direction opposite to the direction in which the blade turns to open the ventilation hole, in a state where the louver closes the ventilation hole.

2. The shutter according to claim 1, wherein in a state where the ventilation hole is opened, an angle of a distal end portion on a turning end side of the louver relative to the base is smaller than an angle of the plane relative to the base.

3. The shutter according to claim 1, wherein a connecting portion of the blade to the turning portion is shifted toward the direction in which the blade turns to open the ventilation hole, with respect to the plane.

4. The shutter according to claim 1, wherein the turning portion has a protrusion which contacts the base when the ventilation hole is opened.

5. The shutter according to claim 1, wherein at least part of the blade is thicker at a connecting portion of the blade to the turning portion than at the turning end.

6. The shutter according to claim 5, wherein a portion of the connecting portion, the portion being thicker than the turning end, protrudes from the turning portion, and contacts the base when the ventilation hole is opened.

7. The shutter according to claim 1, wherein the air receiving surface has a surface formed of flat surfaces which have different gradients and continue to one another.

8. The shutter according to claim 1, wherein the air receiving surface has a curved surface with a steady or varying curvature.

9. The shutter according to claim 1, wherein the blade has a side wall at an end in an axis direction of the turning portion.

10. The shutter according to claim 1, wherein the blade has a rib which extends from a turning portion side toward a turning end side.

11. A fan unit comprising:
    a fan; and
    a shutter disposed downstream of the fan in an air flow direction, wherein the shutter includes
    a base that has a ventilation hole, and
    a louver that is attached to the base and opens and closes the ventilation hole, the louver includes
    a turning portion pivotally and turnably supported on the base, and
    a blade coupled to the turning portion at a first end, the blade turns about a turning axis of the turning portion to open the ventilation hole by receiving air passing through the ventilation hole, and
    the blade has a shape in which an air receiving surface which receives the air is curved toward a direction in which the blade turns to open the ventilation hole, with respect to a plane which couples the turning axis and a turning end of the blade,
    the turning portion includes an air receiving portion coupled to the turning portion at a second end opposite to the first end, with respect to the turning axis in a direction of the fan, in a state where the louver closes the ventilation hole.

12. An electronic apparatus comprising:
    a housing portion that accommodates an electronic component; and
    a fan unit that sucks air inside the housing portion and exhausts the air to an outside of the housing portion, the fan unit includes
    a fan, and
    a shutter disposed downstream of the fan in an air flow direction, the shutter includes
    a base that has a ventilation hole, and
    a louver that is attached to the base and opens and closes the ventilation hole, the louver includes
    a turning portion pivotally and turnably supported on the base, and
    a blade coupled to the turning portion at a first end, the blade turns about a turning axis of the turning portion to open the ventilation hole by receiving air passing through the ventilation hole, and
    the blade has a shape in which an air receiving surface which receives the air is curved toward a direction in which the blade turns to open the ventilation hole, with respect to a plane which couples the turning axis and a turning end of the blade,
    the turning portion includes an air receiving portion coupled to the turning portion at a second end opposite to the first end, with respect to the turning axis in a direction of the fan, in a state where the louver closes the ventilation hole.

* * * * *